US010429449B2

(12) United States Patent
van Bremen

(10) Patent No.: US 10,429,449 B2
(45) Date of Patent: Oct. 1, 2019

(54) BATTERY PACK TESTER

(71) Applicant: Midtronics, Inc., Willowbrook, IL (US)

(72) Inventor: Johannes Arnoldus Theodorus van Bremen, Gelderland (NL)

(73) Assignee: MIDTRONICS, INC., Willowbrook, IL (US)

(*) Notice: Subject to any disclaimer, the term of this patent is extended or adjusted under 35 U.S.C. 154(b) by 616 days.

(21) Appl. No.: 13/672,186

(22) Filed: Nov. 8, 2012

(65) Prior Publication Data

US 2013/0311124 A1 Nov. 21, 2013

Related U.S. Application Data

(60) Provisional application No. 61/558,088, filed on Nov. 10, 2011.

(51) Int. Cl.

*G01R 31/396* (2019.01)
*H01M 10/42* (2006.01)
*H01M 10/48* (2006.01)
*H01M 6/50* (2006.01)
*G01R 31/385* (2019.01)

(52) U.S. Cl.

CPC ......... *G01R 31/396* (2019.01); *G01R 31/386* (2019.01); *H01M 6/5011* (2013.01); *H01M 6/5083* (2013.01); *H01M 10/4207* (2013.01); *H01M 10/4285* (2013.01); *H01M 10/482* (2013.01)

(58) Field of Classification Search

CPC .............. G01R 31/3658; G01R 31/396; G01R 31/386; H01M 6/5011; H01M 6/5083; H01M 10/4285; H01M 10/4207

USPC ............................................................ 702/63

See application file for complete search history.

(56) References Cited

U.S. PATENT DOCUMENTS

| | | | | |
|---|---|---|---|---|
| 85,553 | A | 1/1869 | Adams | 33/472 |
| 2,000,665 | A | 5/1935 | Neal | 439/440 |
| 2,254,846 | A | 9/1941 | Heyer | 324/437 |
| 2,417,940 | A | 3/1947 | Lehman | 200/61.25 |
| 2,437,772 | A | 3/1948 | Wall | 324/523 |
| 2,514,745 | A | 7/1950 | Dalzell | 324/115 |

(Continued)

FOREIGN PATENT DOCUMENTS

| | | | |
|---|---|---|---|
| CN | 2470964 | Y | 1/2002 |
| CN | 201063352 | Y | 5/2008 |

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner* — Janet L Suglo
*Assistant Examiner* — Liam R Casey
(74) *Attorney, Agent, or Firm* — Westman, Champlin & Koehler, P.A.

(57) ABSTRACT

An apparatus and method for testing a battery pack are provided. Measurement circuitry is configured to measure parameters of batteries within the battery pack. The measurement circuitry responsively provides an output indicative of a condition of a battery in the battery pack. The output is based upon a measured parameter of the battery pack and a correction factor.

16 Claims, 4 Drawing Sheets

(56) References Cited

U.S. PATENT DOCUMENTS 2,727,221 A 12/1955 Springg ........................ 340/447
3,025,455 A 3/1962 Jonsson ........................ 323/369
3,178,686 A 4/1965 Mills ........................ 340/447
3,215,194 A 11/1965 Sununu et al. .............. 165/80.3
3,223,969 A 12/1965 Alexander .................... 340/447
3,267,452 A 8/1966 Wolf ........................ 340/249
3,356,936 A 12/1967 Smith ........................ 324/429
3,562,634 A 2/1971 Latner ........................ 324/427
3,593,099 A 7/1971 Scholl ........................ 320/127
3,607,673 A 9/1971 Seyl ........................ 324/425
3,652,341 A 3/1972 Halsall et al. ............... 29/623.2
3,676,770 A 7/1972 Sharaf et al. ................ 324/430
3,699,433 A 10/1972 Smith, Jr. .................... 324/523
3,704,439 A 11/1972 Nelson
3,729,989 A 5/1973 Little ....................... 73/862.192
3,745,441 A 7/1973 Soffer ........................ 290/14
3,750,011 A 7/1973 Kreps ........................ 324/430
3,753,094 A 8/1973 Furuishi et al. .............. 324/430
3,776,177 A 12/1973 Bryant et al. ................ 116/311
3,796,124 A 3/1974 Crosa ........................ 411/521
3,808,522 A 4/1974 Sharaf ........................ 324/430
3,811,089 A 5/1974 Strezelewicz ................ 324/170
3,816,805 A 6/1974 Terry ........................ 320/123
3,850,490 A 11/1974 Zehr ........................ 439/822
3,857,082 A 12/1974 Van Opijnen ................ 320/143
3,873,911 A 3/1975 Champlin .................... 324/430
3,876,931 A 4/1975 Godshalk .................... 324/429
3,879,654 A 4/1975 Kessinger .................... 324/434
3,886,426 A 5/1975 Daggett ........................ 320/117
3,886,443 A 5/1975 Miyakawa et al. ........... 324/426
3,889,248 A 6/1975 Ritter ....................... 340/636.11
3,906,329 A 9/1975 Bader ........................ 320/134
3,909,708 A 9/1975 Champlin .................... 324/431
3,920,284 A 11/1975 Lane et al. .............. 303/122.06
3,936,744 A 2/1976 Perlmutter .................... 324/772
3,939,400 A 2/1976 Steele ........................ 324/434
3,946,299 A 3/1976 Christianson et al. ....... 320/430
3,947,757 A 3/1976 Grube et al. ................. 324/416
3,969,667 A 7/1976 McWilliams ................ 324/427
3,979,664 A 9/1976 Harris ........................ 324/397
3,984,762 A 10/1976 Dowgiallo, Jr. .............. 324/430
3,984,768 A 10/1976 Staples ........................ 324/712
3,989,544 A 11/1976 Santo ........................ 429/65
3,997,830 A 12/1976 Newell et al. ................ 320/102
4,008,619 A 2/1977 Alcaide et al. ................ 73/724
4,023,882 A 5/1977 Pettersson .................... 439/426
4,024,953 A 5/1977 Nailor, III .................... 206/344
4,047,091 A 9/1977 Hutchines et al. ............ 363/59
4,053,824 A 10/1977 Dupuis et al. ............... 324/434
4,056,764 A 11/1977 Endo et al. .................. 320/101
4,057,313 A 11/1977 Polizzano .................... 439/219
4,070,624 A 1/1978 Taylor ........................ 324/772
4,086,531 A 4/1978 Bernier ........................ 324/772
4,106,025 A 8/1978 Katz ........................ 343/715
4,112,351 A 9/1978 Back et al. .................. 324/380
4,114,083 A 9/1978 Benham et al. ......... 340/636.13
4,126,874 A 11/1978 Suzuki et al. ................ 396/301
4,160,916 A 7/1979 Papasideris .................. 307/10.6
4,176,315 A 11/1979 Sunnarborg .................. 324/133
4,178,546 A 12/1979 Hulls et al. .................. 324/772
4,193,025 A 3/1980 Frailing et al. ............... 324/427
4,207,610 A 6/1980 Gordon ....................... 701/33.9
4,207,611 A 6/1980 Gordon ........................ 701/33
4,217,645 A 8/1980 Barry et al. .................. 702/63
4,218,745 A 8/1980 Perkins ........................ 324/66
4,280,457 A 7/1981 Bloxham ................. 123/198 R
4,295,468 A 10/1981 Bartelt
4,297,639 A 10/1981 Branham ...................... 324/429
4,307,342 A 12/1981 Peterson ...................... 324/767
4,315,204 A 2/1982 Sievers et al. ................. 322/28
4,316,185 A 2/1982 Watrous et al. ......... 340/636.11
4,322,685 A 3/1982 Frailing et al. ............... 324/429
4,351,405 A 6/1982 Fields et al. ................. 180/65.2
4,352,067 A 9/1982 Ottone ........................ 324/434
4,360,780 A 11/1982 Skutch, Jr. .................... 324/437
4,361,809 A 11/1982 Bil et al. ....................... 324/426
4,363,407 A 12/1982 Buckler et al. ................ 209/3.3
4,369,407 A 1/1983 Korbell ........................ 324/416
4,379,989 A 4/1983 Kurz et al. .................... 320/165
4,379,990 A 4/1983 Sievers et al. .................. 322/99
4,385,269 A 5/1983 Aspinwall et al. ........... 320/129
4,390,828 A 6/1983 Converse et al. ............ 320/153
4,392,101 A 7/1983 Saar et al. .................... 320/156
4,396,880 A 8/1983 Windebank ................... 320/156
4,408,157 A 10/1983 Beaubien ...................... 324/712
4,412,169 A 10/1983 Dell'Orto ..................... 320/123
4,423,378 A 12/1983 Marino et al. ................ 324/427
4,423,379 A 12/1983 Jacobs et al. ................ 324/429
4,424,491 A 1/1984 Bobbett et al. ............... 324/433
4,425,791 A 1/1984 Kling ........................ 73/116.02
4,441,359 A 4/1984 Ezoe ......................... 73/116.06
4,459,548 A 7/1984 Lentz et al. .................. 324/472
4,502,000 A 2/1985 Mashikian
4,514,694 A 4/1985 Finger ........................ 324/429
4,520,353 A 5/1985 McAuliffe ............... 340/636.16
4,521,498 A 6/1985 Juergens ........................ 429/59
4,544,312 A 10/1985 Stencel
4,560,230 A 12/1985 Inglis ........................ 439/890
4,564,798 A 1/1986 Young ........................ 320/103
4,620,767 A 11/1986 Woolf ........................ 439/217
4,626,765 A * 12/1986 Tanaka ................. G01R 13/406 320/127
4,633,418 A 12/1986 Bishop ........................ 702/63
4,637,359 A 1/1987 Cook ........................ 123/179
4,643,511 A 2/1987 Gawlik ........................ 439/755
4,659,977 A 4/1987 Kissel et al. .................. 320/150
4,663,580 A 5/1987 Wortman ...................... 320/153
4,665,370 A 5/1987 Holland ........................ 324/429
4,667,143 A 5/1987 Cooper et al. ................ 320/153
4,667,279 A 5/1987 Maier ........................ 363/46
4,678,998 A 7/1987 Muramatsu ................... 324/427
4,679,000 A 7/1987 Clark ........................ 324/428
4,680,528 A 7/1987 Mikami et al. ............... 320/165
4,686,442 A 8/1987 Radomski ..................... 320/123
4,697,134 A 9/1987 Burkum et al. .............. 320/134
4,707,795 A 11/1987 Alber et al. .................... 702/63
4,709,202 A 11/1987 Koenck et al. ............... 320/112
4,710,861 A 12/1987 Kanner ........................ 363/46
4,719,428 A 1/1988 Liebermann .................. 324/436
4,723,656 A 2/1988 Kiernan et al. ............... 206/705
4,743,855 A 5/1988 Randin et al. ................ 324/430
4,745,349 A 5/1988 Palanisamy et al. ......... 320/125
4,773,011 A 9/1988 VanHoose ...................... 701/30
4,781,629 A 11/1988 Mize ........................ 439/822
D299,909 S 2/1989 Casey ........................ D10/77
4,816,768 A 3/1989 Champlin .................... 324/428
4,820,966 A 4/1989 Fridman ...................... 320/116
4,825,170 A 4/1989 Champlin .................... 324/436
4,826,457 A 5/1989 Varatta ........................ 439/504
4,847,547 A 7/1989 Eng, Jr. et al. ............... 320/153
4,849,700 A 7/1989 Morioka et al. .............. 324/427
4,874,679 A 10/1989 Miyagawa ...................... 429/91
4,876,495 A 10/1989 Palanisamy et al. ......... 320/106
4,881,038 A 11/1989 Champlin .................... 324/426
4,885,523 A 12/1989 Koench ........................ 230/131
4,888,716 A 12/1989 Ueno ........................ 702/63
4,901,007 A 2/1990 Sworm ........................ 324/110
4,907,176 A 3/1990 Bahnick et al. ......... 364/551.01
4,912,416 A 3/1990 Champlin .................... 324/430
4,913,116 A 4/1990 Katogi et al. ............ 123/406.32
4,926,330 A 5/1990 Abe et al. ....................... 701/33
4,929,931 A 5/1990 McCuen ................. 340/636.15
4,931,738 A 6/1990 MacIntyre et al. ........... 324/435
4,932,905 A 6/1990 Richards ...................... 439/822
4,933,845 A 6/1990 Hayes ........................ 710/104
4,934,957 A 6/1990 Bellusci ........................ 439/504
4,937,528 A 6/1990 Palanisamy ................... 324/430
4,947,124 A 8/1990 Hauser ........................ 324/430
4,949,046 A 8/1990 Seyfang ........................ 324/427
4,956,597 A 9/1990 Heavey et al. ............... 320/129
4,965,738 A 10/1990 Bauer et al. .................. 320/136
4,968,941 A 11/1990 Rogers ........................ 324/428
4,968,942 A 11/1990 Palanisamy ................... 324/430
4,969,834 A 11/1990 Johnson ........................ 439/141

(56) References Cited

U.S. PATENT DOCUMENTS 4,983,086 A 1/1991 Hatrock ..... 411/259
5,004,979 A 4/1991 Marino et al. ..... 324/160
5,030,916 A 7/1991 Bokitch ..... 324/503
5,032,825 A 7/1991 Kuznicki ..... 340/636.15
5,034,893 A 7/1991 Fisher ..... 701/99
5,037,335 A 8/1991 Campbell ..... 439/217
5,037,778 A 8/1991 Stark et al. ..... 228/121
5,047,722 A 9/1991 Wurst et al. ..... 324/430
5,081,565 A 1/1992 Nabha et al. ..... 362/465
5,083,076 A 1/1992 Scott ..... 320/105
5,087,881 A 2/1992 Peacock ..... 324/378
5,095,223 A 3/1992 Thomas ..... 307/110
5,108,320 A 4/1992 Kimber ..... 439/883
5,109,213 A 4/1992 Williams ..... 340/447
5,126,675 A 6/1992 Yang ..... 324/435
5,130,658 A 7/1992 Bohmer ..... 324/435
5,140,269 A 8/1992 Champlin ..... 324/433
5,144,218 A 9/1992 Bosscha ..... 320/139
5,144,248 A 9/1992 Alexandres et al. ..... 324/428
D330,338 S 10/1992 Wang ..... D10/77
5,159,272 A 10/1992 Rao et al. ..... 324/429
5,160,881 A 11/1992 Schramm et al. ..... 322/7
5,164,653 A 11/1992 Reem
5,167,529 A 12/1992 Verge ..... 427/1
5,168,208 A 12/1992 Schultz et al. ..... 322/25
5,170,124 A 12/1992 Blair et al. ..... 324/434
5,179,335 A 1/1993 Nor ..... 320/159
5,187,382 A 2/1993 Kondo
5,194,799 A 3/1993 Tomantschger ..... 320/103
5,204,611 A 4/1993 Nor et al. ..... 320/145
5,214,370 A 5/1993 Harm et al. ..... 320/152
5,214,385 A 5/1993 Gabriel et al. ..... 324/434
5,223,747 A 6/1993 Tschulena ..... 257/713
5,241,275 A 8/1993 Fang ..... 324/430
5,254,952 A 10/1993 Salley et al. ..... 324/429
5,266,880 A 11/1993 Newland ..... 320/125
5,278,759 A 1/1994 Berra et al. ..... 701/1
5,281,919 A 1/1994 Palanisamy ..... 324/427
5,281,920 A 1/1994 Wurst ..... 324/430
5,295,078 A 3/1994 Stich et al. ..... 700/297
5,296,823 A 3/1994 Dietrich ..... 333/161
5,298,797 A 3/1994 Redl ..... 327/387
5,300,874 A 4/1994 Shimamoto et al. ..... 320/106
5,302,902 A 4/1994 Groehl ..... 324/434
5,309,052 A 5/1994 Kim ..... 174/350
5,313,152 A 5/1994 Wozniak et al. ..... 320/118
5,315,287 A 5/1994 Sol ..... 340/455
5,321,626 A 6/1994 Palladino ..... 702/63
5,321,627 A * 6/1994 Reher ..... G01R 31/3648 702/63
5,323,337 A 6/1994 Wilson et al. ..... 702/73
5,325,041 A 6/1994 Briggs ..... 320/149
5,331,268 A 7/1994 Patino et al. ..... 320/158
5,332,927 A 7/1994 Paul et al. ..... 307/66
5,336,993 A 8/1994 Thomas et al. ..... 324/158.1
5,338,515 A 8/1994 Dalla Betta et al. ..... 422/95
5,339,018 A 8/1994 Brokaw ..... 320/147
5,343,380 A 8/1994 Champlin ..... 363/46
5,345,384 A 9/1994 Przybyla et al. ..... 701/29.1
5,347,163 A 9/1994 Yoshimura ..... 307/66
5,349,535 A 9/1994 Gupta ..... 320/106
5,352,968 A 10/1994 Reni et al. ..... 320/136
5,357,519 A 10/1994 Martin et al. ..... 371/15.1
5,365,160 A 11/1994 Leppo et al. ..... 320/160
5,365,453 A 11/1994 Startup et al. ..... 702/36
5,369,364 A 11/1994 Renirie et al. ..... 324/430
5,381,096 A 1/1995 Hirzel ..... 324/427
5,384,540 A 1/1995 Dessel ..... 324/539
5,387,871 A 2/1995 Tsai ..... 324/429
5,394,093 A 2/1995 Cervas ..... 324/556
5,402,007 A 3/1995 Center et al. ..... 290/40 B
5,410,754 A 4/1995 Klotzbach et al. ..... 370/466
5,412,308 A 5/1995 Brown ..... 323/267
5,412,323 A 5/1995 Kato et al. ..... 324/429
5,425,041 A 6/1995 Seko et al. ..... 372/45.01
5,426,371 A 6/1995 Salley et al. ..... 324/429
5,426,416 A 6/1995 Jefferies et al. ..... 340/664
5,430,645 A 7/1995 Keller ..... 364/424.01
5,432,025 A 7/1995 Cox ..... 429/65
5,432,426 A 7/1995 Yoshida ..... 320/160
5,434,495 A 7/1995 Toko ..... 320/135
5,435,185 A 7/1995 Eagan ..... 73/587
5,442,274 A 8/1995 Tamai ..... 320/146
5,445,026 A 8/1995 Eagan ..... 73/591
5,449,996 A 9/1995 Matsumoto et al. ..... 320/148
5,449,997 A 9/1995 Gilmore et al. ..... 320/148
5,451,881 A 9/1995 Finger ..... 324/433
5,453,027 A 9/1995 Buell et al. ..... 439/433
5,457,377 A 10/1995 Jonsson ..... 324/430
5,459,660 A 10/1995 Berra ..... 701/33
5,462,439 A 10/1995 Keith ..... 180/279
5,469,043 A 11/1995 Cherng et al. ..... 320/161
5,485,090 A 1/1996 Stephens ..... 324/433
5,486,123 A 1/1996 Miyazaki ..... 439/825
5,488,300 A 1/1996 Jamieson ..... 324/432
5,504,674 A 4/1996 Chen et al. ..... 705/4
5,508,599 A 4/1996 Koenck ..... 320/138
5,519,383 A 5/1996 De La Rosa ..... 340/636.15
5,528,148 A 6/1996 Rogers ..... 320/137
5,537,967 A 7/1996 Tashiro et al. ..... 123/192.1
5,541,489 A 7/1996 Dunstan ..... 320/134
5,546,317 A 8/1996 Andrieu ..... 702/63
5,548,273 A 8/1996 Nicol et al. ..... 340/439
5,550,485 A 8/1996 Falk ..... 324/772
5,561,380 A 10/1996 Sway-Tin et al. ..... 324/509
5,562,501 A 10/1996 Kinoshita et al. ..... 439/852
5,563,496 A 10/1996 McClure ..... 320/128
5,572,136 A 11/1996 Champlin ..... 324/426
5,573,611 A 11/1996 Koch et al. ..... 152/152.1
5,574,355 A 11/1996 McShane et al. ..... 320/161
5,578,915 A 11/1996 Crouch, Jr. et al. ..... 324/428
5,583,416 A 12/1996 Klang ..... 320/160
5,585,416 A 12/1996 Audett et al. ..... 522/35
5,585,728 A 12/1996 Champlin ..... 324/427
5,589,757 A 12/1996 Klang ..... 320/160
5,592,093 A 1/1997 Klingbiel ..... 324/426
5,592,094 A 1/1997 Ichikawa ..... 324/427
5,596,260 A 1/1997 Moravec et al. ..... 320/135
5,596,261 A 1/1997 Suyama ..... 320/152
5,598,098 A 1/1997 Champlin ..... 324/430
5,602,462 A 2/1997 Stich et al. ..... 323/258
5,606,242 A 2/1997 Hull et al. ..... 320/106
5,614,788 A 3/1997 Mullins et al. ..... 315/82
5,621,298 A 4/1997 Harvey ..... 320/134
5,631,536 A 5/1997 Tseng ..... 320/15
5,631,831 A 5/1997 Bird et al. ..... 701/34.4
5,633,985 A 5/1997 Severson et al. ..... 704/267
5,637,978 A 6/1997 Kellett et al. ..... 320/104
5,642,031 A 6/1997 Brotto ..... 320/156
5,644,212 A 7/1997 Takahashi ..... 320/134
5,650,937 A 7/1997 Bounaga ..... 702/65
5,652,501 A 7/1997 McClure et al. ..... 340/636.15
5,653,659 A 8/1997 Kunibe et al. ..... 477/111
5,654,623 A 8/1997 Shiga et al. ..... 320/106
5,656,920 A 8/1997 Cherng et al. ..... 324/431
5,661,368 A 8/1997 Deol et al. ..... 315/82
5,666,040 A 9/1997 Bourbeau ..... 320/118
5,675,234 A 10/1997 Greene ..... 340/636.11
5,677,077 A 10/1997 Faulk ..... 429/90
5,684,678 A 11/1997 Barrett ..... 363/17
5,685,734 A 11/1997 Kutz ..... 439/371
5,691,621 A 11/1997 Phuoc et al. ..... 320/134
5,699,050 A 12/1997 Kanazawa ..... 340/636.13
5,701,089 A 12/1997 Perkins ..... 324/772
5,705,929 A 1/1998 Caravello et al. ..... 324/430
5,707,015 A 1/1998 Guthrie ..... 241/120
5,710,503 A 1/1998 Sideris et al. ..... 320/116
5,711,648 A 1/1998 Hammerslag ..... 414/800
5,712,795 A 1/1998 Layman et al. ..... 700/297
5,717,336 A 2/1998 Basell et al. ..... 324/430
5,717,937 A 2/1998 Fritz ..... 713/300
5,721,688 A 2/1998 Bramwell ..... 324/426
5,732,074 A 3/1998 Spaur et al. ..... 370/313
5,739,667 A 4/1998 Matsuda et al. ..... 320/128

(56) References Cited

U.S. PATENT DOCUMENTS 5,744,962 A 4/1998 Alber et al. .................. 324/426
5,745,044 A 4/1998 Hyatt, Jr. et al. ............ 340/5.23
5,747,189 A 5/1998 Perkins ........................... 429/91
5,747,909 A 5/1998 Syverson et al. ........ 310/156.56
5,747,967 A 5/1998 Muljadi et al. ............... 320/148
5,754,417 A 5/1998 Nicollini ......................... 363/60
5,757,192 A 5/1998 McShane et al. ............ 324/427
5,760,587 A 6/1998 Harvey ......................... 324/434
5,772,468 A 6/1998 Kowalski et al. ............ 439/506
5,773,962 A 6/1998 Nor .............................. 320/134
5,773,978 A 6/1998 Becker .......................... 324/430
5,778,326 A 7/1998 Moroto et al. .................. 701/22
5,780,974 A 7/1998 Pabla et al. ..................... 315/82
5,780,980 A 7/1998 Naito ............................ 318/139
5,789,899 A 8/1998 van Phuoc et al. .......... 320/112
5,793,359 A 8/1998 Ushikubo ..................... 345/169
5,796,239 A 8/1998 van Phuoc et al. .......... 320/107
5,808,469 A 9/1998 Kopera ......................... 324/434
5,811,979 A 9/1998 Rhein ........................... 324/718
5,818,201 A 10/1998 Stockstad et al. ............ 320/119
5,818,234 A 10/1998 McKinnon .................... 324/433
5,820,407 A 10/1998 Morse et al. ................. 439/504
5,821,756 A 10/1998 McShane et al. ............ 324/430
5,821,757 A 10/1998 Alvarez et al. ............... 324/434
5,825,174 A 10/1998 Parker .......................... 324/106
5,826,467 A 10/1998 Huang
5,831,435 A 11/1998 Troy ............................ 324/426
5,832,396 A 11/1998 Moroto et al. .................. 701/22
5,850,113 A 12/1998 Weimer et al. ............... 307/125
5,862,515 A 1/1999 Kobayashi et al. ............ 702/63
5,865,638 A 2/1999 Trafton ......................... 439/288
5,869,951 A 2/1999 Takahashi ..................... 320/104
5,870,018 A 2/1999 Person ......................... 307/10.2
5,871,858 A 2/1999 Thomsen et al. ................ 429/7
5,872,443 A 2/1999 Williamson .................. 320/160
5,872,453 A 2/1999 Shimoyama et al. ........ 324/431
5,883,306 A 3/1999 Hwang ........................ 73/146.8
5,884,202 A 3/1999 Arjomand .................... 701/31.4
5,895,440 A 4/1999 Proctor et al. .................. 702/63
5,903,154 A 5/1999 Zhang et al. ................. 324/437
5,903,716 A 5/1999 Kimber et al. ............... 395/114
5,912,534 A 6/1999 Benedict ......................... 315/82
5,914,605 A 6/1999 Bertness ....................... 324/430
5,916,287 A 6/1999 Arjomand et al. .......... 701/33.2
5,927,938 A 7/1999 Hammerslag ................. 414/809
5,929,609 A 7/1999 Joy et al. ........................ 322/25
5,935,180 A 8/1999 Fieramosca et al. ........ 701/29.6
5,939,855 A 8/1999 Proctor et al. ................ 320/104
5,939,861 A 8/1999 Joko et al. .................... 320/122
5,945,829 A 8/1999 Bertness ....................... 324/430
5,946,605 A 8/1999 Takahisa et al. ............... 455/68
5,950,144 A 9/1999 Hall et al. ..................... 702/108
5,951,229 A 9/1999 Hammerslag ................. 414/398
5,953,322 A 9/1999 Kimball ........................ 370/328
5,955,951 A 9/1999 Wischerop et al. ....... 340/572.8
5,961,561 A 10/1999 Wakefield, II .................. 701/29
5,961,604 A 10/1999 Anderson et al. ............ 709/229
5,963,012 A 10/1999 Garcia et al. ................. 320/106
5,969,625 A 10/1999 Russo ...................... 340/636.19
5,973,598 A 10/1999 Beigel ........................ 340/572.1
5,978,805 A 11/1999 Carson ........................... 707/10
5,982,138 A 11/1999 Krieger ......................... 320/105
5,990,664 A 11/1999 Rahman ........................ 320/136
6,002,238 A 12/1999 Champlin ..................... 320/134
6,005,489 A 12/1999 Siegle et al. ............. 340/825.69
6,005,759 A 12/1999 Hart et al. ...................... 361/66
6,008,652 A 12/1999 Theofanopoulos et al. ................ 324/434
6,009,369 A 12/1999 Boisvert et al. ................ 701/99
6,016,047 A 1/2000 Notten et al. ................. 320/137
6,031,354 A 2/2000 Wiley et al. .................. 320/116
6,031,368 A 2/2000 Klippel et al. ................ 324/133
6,037,745 A 3/2000 Koike et al. .................. 320/104
6,037,751 A 3/2000 Klang ........................... 320/160
6,037,777 A 3/2000 Champlin ..................... 324/430
6,037,778 A 3/2000 Makhija ........................ 324/433
6,037,749 A 4/2000 Parsonage ..................... 320/132
6,046,514 A 4/2000 Rouillard et al. .............. 307/77
6,051,976 A 4/2000 Bertness ....................... 324/426
6,055,468 A 4/2000 Kaman et al. .................. 701/29
6,061,638 A 5/2000 Joyce ............................. 702/63
6,064,372 A 5/2000 Kahkoska ..................... 345/173
6,072,299 A 6/2000 Kurle et al. ................. 320/112
6,072,300 A 6/2000 Tsuji ............................ 320/116
6,075,339 A 6/2000 Reipur et al. ................ 320/110
6,081,098 A 6/2000 Bertness et al. .............. 320/134
6,081,109 A 6/2000 Seymour et al. ............. 324/127
6,081,154 A 6/2000 Ezell et al. ................... 327/540
6,087,815 A 7/2000 Pfeifer et al. ................ 323/282
6,091,238 A 7/2000 McDermott ............... 324/207.2
6,091,245 A 7/2000 Bertness ....................... 324/426
6,094,033 A 7/2000 Ding et al. .................... 320/132
6,097,193 A 8/2000 Bramwell ..................... 324/429
6,100,670 A 8/2000 Levesque ...................... 320/150
6,100,815 A 8/2000 Pailthorp ................. 324/754.07
6,104,167 A 8/2000 Bertness et al. .............. 320/132
6,113,262 A 9/2000 Purola et al. ................... 374/45
6,114,834 A 9/2000 Parise ........................... 320/109
6,121,880 A 9/2000 Scott et al. ................ 340/572.5
6,136,914 A 10/2000 Hergenrother et al. ...... 524/495
6,137,269 A 10/2000 Champlin ..................... 320/150
6,140,797 A 10/2000 Dunn ............................ 320/105
6,141,608 A 10/2000 Rother ......................... 701/29.6
6,144,185 A 11/2000 Dougherty et al. .......... 320/132
6,147,598 A 11/2000 Murphy et al. .......... 340/426.19
6,149,653 A 11/2000 Deslauriers ................... 606/232
6,150,793 A 11/2000 Lesesky et al. ............. 320/104
6,158,000 A 12/2000 Collins ............................ 713/1
6,161,640 A 12/2000 Yamaguchi ................. 180/65.8
6,163,156 A 12/2000 Bertness ....................... 324/426
6,164,063 A 12/2000 Mendler ......................... 60/274
6,167,349 A 12/2000 Alvarez .......................... 702/63
6,172,483 B1 1/2001 Champlin ..................... 320/134
6,172,505 B1 1/2001 Bertness ....................... 324/430
6,177,737 B1 1/2001 Palfey et al. ................... 307/64
6,181,545 B1 1/2001 Amatucci et al. ............ 361/502
6,184,655 B1 2/2001 Malackowski ............... 320/116
6,184,656 B1 2/2001 Karunasiri et al. ........... 320/119
6,191,557 B1 2/2001 Gray et al. .................... 320/132
6,202,739 B1 3/2001 Pal et al. ................. 165/104.33
6,211,651 B1 4/2001 Nemoto ........................ 320/133
6,211,653 B1 4/2001 Stasko .......................... 320/149
6,215,275 B1 4/2001 Bean ............................ 320/106
6,218,805 B1 4/2001 Melcher ........................ 320/105
6,218,936 B1 4/2001 Imao ............................ 340/447
6,222,342 B1 4/2001 Eggert et al. ................. 320/105
6,222,369 B1 4/2001 Champlin ..................... 324/430
D442,503 S 5/2001 Lundbeck et al. ............. D10/77
6,225,808 B1 5/2001 Varghese et al. ............. 324/426
6,225,898 B1 5/2001 Kamiya et al. ............... 340/505
6,236,186 B1 5/2001 Helton et al. ................. 320/106
6,236,332 B1 5/2001 Conkright et al. ............ 340/3.1
6,236,949 B1 5/2001 Hart ............................... 702/64
6,238,253 B1 5/2001 Qualls .......................... 439/759
6,242,887 B1 6/2001 Burke ........................... 320/104
6,242,921 B1 6/2001 Thibedeau et al. ........... 324/429
6,249,124 B1 6/2001 Bertness ....................... 324/426
6,250,973 B1 6/2001 Lowery et al. ............... 439/763
6,252,942 B1 6/2001 Zoiss ............................. 379/19
6,254,438 B1 7/2001 Gaunt ........................... 439/755
6,255,826 B1 7/2001 Ohsawa ........................ 320/116
6,259,170 B1 7/2001 Limoge et al. .............. 307/10.8
6,259,254 B1 7/2001 Klang ........................... 324/427
6,262,563 B1 7/2001 Champlin ..................... 320/134
6,262,692 B1 7/2001 Babb ............................ 343/895
6,263,268 B1 7/2001 Nathanson ...................... 701/29
6,263,322 B1 7/2001 Kirkevold et al. ........... 705/400
6,271,643 B1 8/2001 Becker et al. ................ 320/112
6,271,748 B1 8/2001 Derbyshire et al. .......... 340/442
6,272,387 B1 8/2001 Yoon .............................. 700/83
6,275,008 B1 8/2001 Arai et al. .................... 320/132
6,285,191 B1 9/2001 Gollomp et al. ............. 324/427
6,294,896 B1 9/2001 Champlin ..................... 320/134
6,294,897 B1 9/2001 Champlin ..................... 320/153

(56) References Cited

U.S. PATENT DOCUMENTS 6,304,087 B1 10/2001 Bertness ........ 324/426
6,307,349 B1 10/2001 Koenck et al. ........ 320/112
6,310,481 B2 10/2001 Bertness ........ 324/430
6,313,607 B1 11/2001 Champlin ........ 320/132
6,313,608 B1 11/2001 Varghese et al. ........ 320/132
6,316,914 B1 11/2001 Bertness ........ 320/134
6,320,351 B1 11/2001 Ng et al. ........ 320/104
6,323,650 B1 11/2001 Bertness et al. ........ 324/426
6,324,042 B1 11/2001 Andrews ........ 361/93.2
6,329,793 B1 12/2001 Bertness et al. ........ 320/132
6,331,762 B1 12/2001 Bertness ........ 320/134
6,332,113 B1 12/2001 Bertness ........ 702/63
6,346,795 B2 2/2002 Haraguchi et al. ........ 320/136
6,347,958 B1 2/2002 Tsai ........ 439/488
6,351,102 B1 2/2002 Troy ........ 320/139
6,356,042 B1 3/2002 Kahlon et al. ........ 318/138
6,356,083 B1 3/2002 Ying ........ 324/426
6,359,441 B1 3/2002 Bertness ........ 324/426
6,359,442 B1 3/2002 Henningson et al. ........ 324/426
6,363,303 B1 3/2002 Bertness ........ 701/29
RE37,677 E 4/2002 Irie ........ 315/83
6,377,031 B1 4/2002 Karuppana et al. ........ 323/220
6,384,608 B1 5/2002 Namaky ........ 324/430
6,388,448 B1 5/2002 Cervas ........ 324/426
6,389,337 B1 5/2002 Kolls ........ 701/31.6
6,392,414 B2 5/2002 Bertness ........ 324/429
6,396,278 B1 5/2002 Makhija ........ 324/402
6,407,554 B1 6/2002 Godau et al. ........ 324/503
6,411,098 B1 6/2002 Laletin ........ 324/436
6,417,669 B1 7/2002 Champlin ........ 324/426
6,420,852 B1 7/2002 Sato ........ 320/134
6,424,157 B1 7/2002 Gollomp et al. ........ 324/430
6,424,158 B2 7/2002 Klang ........ 324/433
6,433,512 B1 8/2002 Birkler et al. ........ 320/132
6,437,957 B1 8/2002 Karuppana et al. ........ 361/78
6,441,585 B1 8/2002 Bertness ........ 320/132
6,445,158 B1 9/2002 Bertness et al. ........ 320/104
6,448,778 B1 9/2002 Rankin ........ 324/503
6,449,726 B1 9/2002 Smith ........ 713/340
6,456,036 B1 9/2002 Thandiwe ........ 320/106
6,456,045 B1 9/2002 Troy et al. ........ 320/139
6,465,908 B1 10/2002 Karuppana et al. ........ 307/31
6,466,025 B1 10/2002 Klang ........ 324/429
6,466,026 B1 10/2002 Champlin ........ 324/430
6,469,511 B1 10/2002 Vonderhaar et al. ........ 324/425
6,473,659 B1 10/2002 Shah et al. ........ 700/79
6,477,478 B1 11/2002 Jones et al. ........ 702/102
6,495,990 B2 12/2002 Champlin ........ 320/132
6,497,209 B1 12/2002 Karuppana et al. ........ 123/179.3
6,500,025 B1 12/2002 Moenkhaus et al. ........ 439/502
6,501,243 B1 12/2002 Kaneko ........ 318/139
6,505,507 B1 1/2003 Imao ........ 73/146.5
6,507,196 B2 1/2003 Thomsen et al. ........ 324/436
6,526,361 B1 2/2003 Jones et al. ........ 702/63
6,529,723 B1 3/2003 Bentley ........ 455/405
6,531,848 B1 3/2003 Chitsazan et al. ........ 320/153
6,532,425 B1 3/2003 Boost et al. ........ 702/63
6,533,316 B2 3/2003 Breed et al. ........ 280/735
6,534,992 B2 3/2003 Meissner et al. ........ 324/426
6,534,993 B2 3/2003 Bertness ........ 324/433
6,536,536 B1 3/2003 Gass et al. ........ 173/2
6,544,078 B2 4/2003 Palmisano et al. ........ 439/762
6,545,599 B2 4/2003 Derbyshire et al. ........ 340/442
6,556,019 B2 4/2003 Bertness ........ 324/426
6,566,883 B1 5/2003 Vonderhaar et al. ........ 324/426
6,570,385 B1 5/2003 Roberts et al. ........ 324/378
6,577,107 B2 6/2003 Kechmire ........ 320/139
6,586,941 B2 7/2003 Bertness et al. ........ 324/426
6,597,150 B1 7/2003 Bertness et al. ........ 320/104
6,599,243 B2 7/2003 Woltermann et al. ........ 600/300
6,600,815 B1 7/2003 Walding ........ 379/93.07
6,611,740 B2 8/2003 Lowrey et al. ........ 701/29
6,614,349 B1 9/2003 Proctor et al. ........ 340/572.1
6,618,644 B2 9/2003 Bean ........ 700/231
6,621,272 B2 9/2003 Champlin ........ 324/426
6,623,314 B1 9/2003 Cox et al. ........ 439/759
6,624,635 B1 9/2003 Lui ........ 324/426
6,628,011 B2 9/2003 Droppo et al. ........ 307/43
6,629,054 B2 9/2003 Makhija et al. ........ 702/113
6,633,165 B2 10/2003 Bertness ........ 324/426
6,635,974 B1 10/2003 Karuppana et al. ........ 307/140
6,636,790 B1 10/2003 Lightner et al. ........ 701/33
6,667,624 B1 12/2003 Raichle et al. ........ 324/522
6,679,212 B2 1/2004 Kelling ........ 123/179.28
6,686,542 B2 2/2004 Zhang ........ 174/74
6,696,819 B2 2/2004 Bertness ........ 320/134
6,707,303 B2 3/2004 Bertness et al. ........ 324/426
6,732,031 B1 5/2004 Lightner et al. ........ 701/31.4
6,736,941 B2 5/2004 Oku et al. ........ 203/68
6,737,831 B2 5/2004 Champlin ........ 320/132
6,738,697 B2 5/2004 Breed ........ 701/29
6,740,990 B2 5/2004 Tozuka et al. ........ 307/9.1
6,744,149 B1 6/2004 Karuppana et al. ........ 307/31
6,745,153 B2 6/2004 White et al. ........ 702/184
6,759,849 B2 7/2004 Bertness ........ 324/426
6,771,073 B2 8/2004 Henningson et al. ........ 324/426
6,777,945 B2 8/2004 Roberts et al. ........ 324/426
6,781,344 B1 8/2004 Hedegor et al. ........ 320/106
6,781,382 B2 8/2004 Johnson ........ 324/426
6,784,635 B2 8/2004 Larson ........ 320/104
6,784,637 B2 8/2004 Raichle et al. ........ 320/107
6,788,025 B2 9/2004 Bertness et al. ........ 320/104
6,795,782 B2 9/2004 Bertness et al. ........ 702/63
6,796,841 B1 9/2004 Cheng et al. ........ 439/620.3
6,805,090 B2 10/2004 Bertness et al. ........ 123/198
6,806,716 B2 10/2004 Bertness et al. ........ 324/426
6,825,669 B2 11/2004 Raichle et al. ........ 324/426
6,832,141 B2 12/2004 Skeen et al. ........ 701/31.4
6,842,707 B2 1/2005 Raichle et al. ........ 702/62
6,845,279 B1 1/2005 Gilmore et al. ........ 700/115
6,850,037 B2 2/2005 Bertness ........ 320/132
6,856,162 B1 2/2005 Greatorex et al. ........ 324/764.01
6,856,972 B1 2/2005 Yun et al. ........ 705/36 R
6,871,151 B2 3/2005 Bertness ........ 702/63
6,885,195 B2 4/2005 Bertness ........ 324/426
6,888,468 B2 5/2005 Bertness ........ 340/636.15
6,891,378 B2 5/2005 Bertness et al. ........ 324/426
6,895,809 B2 5/2005 Raichle ........ 73/119
6,904,796 B2 6/2005 Pacsai et al. ........ 73/146.8
6,906,522 B2 6/2005 Bertness et al. ........ 324/426
6,906,523 B2 6/2005 Bertness et al. ........ 324/426
6,906,624 B2 6/2005 McClelland et al. ........ 340/442
6,909,287 B2 6/2005 Bertness ........ 324/427
6,909,356 B2 6/2005 Brown et al. ........ 340/3.2
6,911,825 B2 6/2005 Namaky ........ 324/426
6,913,483 B2 7/2005 Restaino et al. ........ 439/504
6,914,413 B2 7/2005 Bertness et al. ........ 320/104
6,919,725 B2 7/2005 Bertness et al. ........ 324/433
6,930,485 B2 8/2005 Bertness et al. ........ 324/426
6,933,727 B2 8/2005 Bertness et al. ........ 324/426
6,941,234 B2 9/2005 Bertness et al. ........ 702/63
6,957,133 B1 10/2005 Hunt et al. ........ 701/32.4
6,966,676 B2 11/2005 Chabert et al.
6,967,484 B2 11/2005 Bertness ........ 324/426
6,972,662 B1 12/2005 Ohkawa et al. ........ 340/10.1
6,983,212 B2 1/2006 Burns ........ 702/63
6,988,053 B2 1/2006 Namaky ........ 320/104
6,993,421 B2 1/2006 Pillar et al. ........ 701/29.4
6,998,847 B2 2/2006 Bertness et al. ........ 324/426
7,003,410 B2 2/2006 Bertness et al. ........ 702/63
7,003,411 B2 2/2006 Bertness ........ 702/63
7,012,433 B2 3/2006 Smith et al. ........ 324/426
7,015,674 B2 3/2006 VonderHaar ........ 320/103
7,029,338 B1 4/2006 Orange et al. ........ 439/755
7,034,541 B2 4/2006 Bertness et al. ........ 324/426
7,039,533 B2 5/2006 Bertness et al. ........ 702/63
7,042,346 B2 5/2006 Paulsen ........ 340/438
7,049,822 B2 5/2006 Kung ........ 324/426
7,058,525 B2 6/2006 Bertness et al. ........ 702/63
7,069,979 B2 7/2006 Tobias ........ 165/104.33
7,081,755 B2 7/2006 Klang et al. ........ 324/426
7,089,127 B2 8/2006 Thibedeau et al. ........ 702/63
7,098,666 B2 8/2006 Patino ........ 324/433
7,102,556 B2 9/2006 White ........ 341/141

(56) References Cited

U.S. PATENT DOCUMENTS 7,106,070 B2 9/2006 Bertness et al. .............. 324/538
7,116,109 B2 10/2006 Klang ........................... 324/426
7,119,686 B2 10/2006 Bertness et al. ........... 340/572.1
7,120,488 B2 10/2006 Nova et al. ....................... 600/2
7,126,341 B2 10/2006 Bertness et al. .............. 324/426
7,129,706 B2 10/2006 Kalley .......................... 324/426
7,154,276 B2 12/2006 Bertness ....................... 324/503
7,170,393 B2 1/2007 Martin ......................... 340/10.1
7,173,182 B2 2/2007 Katsuyama ..................... 174/36
7,177,925 B2 2/2007 Carcido et al. ............... 709/223
7,182,147 B2 2/2007 Cutler et al. ...................... 173/1
7,184,866 B2 2/2007 Squires .................... 340/426.15
7,184,905 B2 2/2007 Stefan ............................ 702/63
7,198,510 B2 4/2007 Bertness ....................... 439/500
7,200,424 B2 4/2007 Tischer et al. ................ 455/567
7,202,636 B2 4/2007 Reynolds et al. ............ 320/166
7,208,914 B2 4/2007 Klang ........................... 320/132
7,209,850 B2 4/2007 Brott et al. ................... 324/426
7,209,860 B2 4/2007 Trsar et al. ................... 702/183
7,212,887 B2 5/2007 Shah et al. .................... 700/276
7,212,911 B2 5/2007 Raichle et al. ............... 701/114
7,219,023 B2 5/2007 Banke et al. ................... 702/58
7,233,128 B2 6/2007 Brost et al. ................... 320/132
7,235,977 B2 6/2007 Koran et al. .................. 324/426
7,246,015 B2 7/2007 Bertness et al. ................ 702/63
7,251,551 B2 7/2007 Mitsueda .......................... 700/2
7,272,519 B2 9/2007 Lesesky et al. ................ 702/63
7,287,001 B1 10/2007 Falls et al. ...................... 705/22
7,295,936 B2 11/2007 Bertness et al. ................ 702/63
7,301,303 B1 11/2007 Hulden ........................ 320/103
7,319,304 B2 1/2008 Veloo et al. .................. 320/134
7,339,477 B2 3/2008 Puzio et al. ............... 340/572.1
7,363,175 B2 4/2008 Bertness et al. ................ 702/63
7,376,497 B2 5/2008 Chen ........................... 701/31.6
7,398,176 B2 7/2008 Bertness ....................... 702/140
7,408,358 B2 8/2008 Knopf ........................... 324/426
7,425,833 B2 9/2008 Bertness et al. .............. 324/426
7,446,536 B2 11/2008 Bertness ....................... 324/426
7,453,238 B2 11/2008 Melichar ....................... 320/132
7,479,763 B2 1/2009 Bertness ....................... 320/134
7,498,767 B2 3/2009 Brown et al. ................. 320/107
7,501,795 B2 3/2009 Bertness et al. .............. 320/134
7,505,856 B2 3/2009 Restaino et al. ................ 702/63
7,538,571 B2 5/2009 Raichle et al. ............... 324/772
7,545,146 B2 6/2009 Klang et al. .................. 324/426
7,557,586 B1 7/2009 Vonderhaar et al. ......... 324/437
7,590,476 B2 9/2009 Shumate ...................... 701/31.6
7,592,776 B2 9/2009 Tsukamoto et al. .......... 320/136
7,595,643 B2 9/2009 Klang ........................... 324/426
7,598,699 B2 10/2009 Restaino et al. ............. 320/105
7,598,743 B2 10/2009 Bertness ....................... 324/426
7,598,744 B2 10/2009 Bertness et al. .............. 324/426
7,619,417 B2 11/2009 Klang ........................... 324/427
7,642,786 B2 1/2010 Philbrook ..................... 324/426
7,642,787 B2 1/2010 Bertness et al. .............. 324/426
7,656,162 B2 2/2010 Vonderhaar et al. ......... 324/426
7,657,386 B2 2/2010 Thibedeau et al. ............. 702/63
7,667,437 B2 2/2010 Johnson et al. .............. 320/150
7,679,325 B2 3/2010 Seo ............................... 320/116
7,684,908 B1 3/2010 Ogilvie et al. ............... 701/29.6
7,688,074 B2 3/2010 Cox et al. ..................... 324/426
7,690,573 B2 4/2010 Raichle et al. ............... 235/462
7,696,759 B2 4/2010 Raichle et al. ............... 324/538
7,698,179 B2 4/2010 Leung et al. ................... 705/28
7,705,602 B2 4/2010 Bertness ....................... 324/426
7,706,991 B2 4/2010 Bertness et al. ................ 702/63
7,706,992 B2 4/2010 Ricci et al.
7,710,119 B2 5/2010 Bertness ....................... 324/426
7,723,993 B2 5/2010 Klang ........................... 324/431
7,728,556 B2 6/2010 Yano et al. ................... 320/134
7,728,597 B2 6/2010 Bertness ....................... 324/426
7,729,880 B1 6/2010 Mashburn ..................... 702/151
7,743,788 B2 6/2010 Schmitt ......................... 137/554
7,751,953 B2 7/2010 Namaky ...................... 701/33.2
7,772,850 B2 8/2010 Bertness ....................... 324/426
7,774,130 B2 8/2010 Pepper .......................... 340/439
7,774,151 B2 8/2010 Bertness ......................... 702/63
7,777,612 B2 8/2010 Sampson et al. .......... 340/426.1
7,791,348 B2 9/2010 Brown et al. ................. 324/426
7,808,375 B2 10/2010 Bertness et al. .............. 340/455
7,848,857 B2 12/2010 Nasr et al. ...................... 701/22
7,883,002 B2 2/2011 Jin et al. ....................... 235/376
7,902,990 B2 3/2011 Delmonico et al. ....... 340/636.1
7,914,350 B1 3/2011 Bozich .......................... 439/506
7,924,015 B2 4/2011 Bertness
7,940,052 B2 5/2011 Vonderhaar
7,940,053 B2 5/2011 Brown et al. ................. 324/426
7,959,476 B2 6/2011 Smith et al.
7,977,914 B2 7/2011 Bertness
D643,759 S 8/2011 Bertness
7,990,155 B2 8/2011 Henningson .................. 324/429
7,999,505 B2 8/2011 Bertness ....................... 320/104
8,024,083 B2 9/2011 Chenn ............................... 701/2
8,047,868 B1 11/2011 Korcynski .................... 439/522
8,164,343 B2 4/2012 Bertness ....................... 324/503
8,198,900 B2 6/2012 Bertness et al.
8,203,345 B2 6/2012 Bertness
8,222,868 B2 7/2012 Buckner ....................... 320/136
8,226,008 B2 7/2012 Raichle et al. .......... 235/462.13
8,237,448 B2 8/2012 Bertness
8,306,690 B2 11/2012 Bertness ...................... 701/34.4
8,310,271 B2 11/2012 Raichle et al. .......... 324/765.01
8,344,685 B2 1/2013 Bertness et al.
8,436,619 B2 5/2013 Bertness et al.
8,442,877 B2 5/2013 Bertness et al.
8,449,560 B2 5/2013 Roth .......................... 227/175.1
8,493,022 B2 7/2013 Bertness
D687,727 S 8/2013 Kehoe et al.
8,509,212 B2 8/2013 Sanjeev
8,513,949 B2 8/2013 Bertness
8,594,957 B2 11/2013 Gauthier ....................... 324/548
8,674,654 B2 3/2014 Bertness
8,674,711 B2 3/2014 Bertness
8,704,483 B2 4/2014 Bertness et al.
8,738,309 B2 5/2014 Bertness
8,754,653 B2 6/2014 Volderhaar et al.
8,825,272 B1 9/2014 Chinnadurai
8,827,729 B2 9/2014 Gunreben ..................... 439/188
8,872,516 B2 10/2014 Bertness
8,872,517 B2 10/2014 Philbrook et al.
8,958,998 B2 2/2015 Bertness
8,963,550 B2 2/2015 Bertness et al.
9,018,958 B2 4/2015 Bertness
9,037,394 B2 5/2015 Fernandes ..................... 701/400
9,052,366 B2 6/2015 Bertness
9,201,120 B2 12/2015 Stukenburg
9,229,062 B2 1/2016 Stukenberg
9,244,100 B2 1/2016 Coleman et al.
9,255,955 B2 2/2016 Bertness ....................... 324/503
9,274,157 B2 3/2016 Bertness
9,312,575 B2 4/2016 Stukenberg
9,335,362 B2 5/2016 Bertness
9,419,311 B2 8/2016 Bertness
9,425,487 B2 8/2016 Bertness
9,496,720 B2 11/2016 McShane
9,588,185 B2 3/2017 Champlin
9,639,899 B1 5/2017 Gersitz
9,923,289 B2 3/2018 Bertness
9,966,676 B2 5/2018 Salo, III et al.
10,046,649 B2 8/2018 Bertness
2001/0012738 A1 8/2001 Duperret ....................... 439/835
2001/0033169 A1* 10/2001 Singh ................. G01R 31/3662 324/426
2001/0035737 A1 11/2001 Nakanishi et al. ........... 320/122
2001/0048215 A1 12/2001 Breed et al. ............... 280/728.1
2001/0048226 A1 12/2001 Nada .............................. 290/40
2002/0003423 A1 1/2002 Bertness et al. .............. 324/426
2002/0004694 A1 1/2002 McLeod ......................... 701/29
2002/0007237 A1 1/2002 Phung et al. ................... 701/33
2002/0010558 A1 1/2002 Bertness et al.
2002/0021135 A1 2/2002 Li et al. ........................ 324/677
2002/0027346 A1 3/2002 Breed et al. ................. 280/735
2002/0030495 A1 3/2002 Kechmire ..................... 324/427
2002/0036481 A1 3/2002 Nagase

(56) References Cited

U.S. PATENT DOCUMENTS

2002/0036504 A1 3/2002 Troy et al. .................... 324/430
2002/0041175 A1 4/2002 Lauper et al. ................ 320/106
2002/0044050 A1 4/2002 Derbyshire et al. .......... 340/442
2002/0047711 A1 4/2002 Bertness et al.
2002/0050163 A1 5/2002 Makhija et al. ................ 73/116
2002/0065619 A1 5/2002 Bertness et al.
2002/0074398 A1 6/2002 Lancos et al. ................ 235/382
2002/0116140 A1* 8/2002 Rider ............................. 702/63
2002/0118111 A1 8/2002 Brown et al. .............. 340/573.1
2002/0121901 A1 9/2002 Hoffman ....................... 324/426
2002/0128985 A1 9/2002 Greenwald ................... 705/400
2002/0130665 A1 9/2002 Bertness et al. .............. 324/426
2002/0153864 A1 10/2002 Bertness ....................... 320/132
2002/0171428 A1 11/2002 Bertness ......................... 702/63
2002/0176010 A1 11/2002 Wallach et al. ............... 348/362
2002/0193955 A1 12/2002 Bertness ......................... 702/63
2003/0006779 A1 1/2003 Youval .......................... 324/503
2003/0009270 A1 1/2003 Breed ............................. 701/29
2003/0017753 A1 1/2003 Palmisano et al. ........... 439/762
2003/0025481 A1 2/2003 Bertness ....................... 324/427
2003/0030442 A1* 2/2003 Sugimoto .......... G01R 31/3658 324/429
2003/0036909 A1 2/2003 Kato ............................ 704/275
2003/0040873 A1 2/2003 Lesesky et al. ................ 702/57
2003/0060953 A1 3/2003 Chen .............................. 701/33
2003/0078743 A1 4/2003 Bertness et al. ................ 702/63
2003/0088375 A1 5/2003 Bertness et al.
2003/0090272 A1 5/2003 Bertness ....................... 324/426
2003/0114206 A1 6/2003 Timothy .................... 455/575.7
2003/0124417 A1 7/2003 Bertness et al. ................ 429/90
2003/0128011 A1 7/2003 Bertness et al.
2003/0128036 A1 7/2003 Henningson et al. ........ 324/426
2003/0137277 A1 7/2003 Mori et al. .................... 320/132
2003/0155930 A1 8/2003 Thomsen
2003/0164073 A1 9/2003 Chen
2003/0169018 A1 9/2003 Berels et al. ................. 320/132
2003/0169019 A1 9/2003 Oosaki ......................... 320/132
2003/0171111 A1 9/2003 Clark ......................... 455/414.1
2003/0173971 A1 9/2003 Bertness ....................... 324/441
2003/0177417 A1 9/2003 Malhotra et al. .............. 714/42
2003/0184262 A1 10/2003 Makhija ....................... 320/156
2003/0184264 A1 10/2003 Bertness
2003/0184306 A1 10/2003 Bertness et al. .............. 324/426
2003/0187556 A1 10/2003 Suzuki ............................ 701/29
2003/0194672 A1 10/2003 Roberts et al. .............. 431/196
2003/0197512 A1 10/2003 Miller et al. .................. 324/426
2003/0212311 A1 11/2003 Nova et al. ................... 600/300
2003/0214395 A1 11/2003 Flowerday et al. .......... 340/445
2003/0224241 A1 12/2003 Takada et al. .................. 429/52
2003/0236656 A1 12/2003 Dougherty ...................... 703/14
2004/0000590 A1 1/2004 Raichle et al. .......... 235/462.01
2004/0000891 A1 1/2004 Raichle et al. ............... 320/107
2004/0000893 A1 1/2004 Raichle et al. ............... 320/135
2004/0000913 A1 1/2004 Raichle et al. ............... 324/426
2004/0000915 A1 1/2004 Raichle et al. ............... 324/522
2004/0002824 A1 1/2004 Raichle et al. ................. 702/63
2004/0002825 A1 1/2004 Raichle et al. ................. 702/63
2004/0002836 A1 1/2004 Raichle et al. ............... 702/188
2004/0032264 A1 2/2004 Schoch ........................ 324/426
2004/0036443 A1 2/2004 Bertness ....................... 320/109
2004/0044452 A1 3/2004 Bauer et al. .................... 703/33
2004/0044454 A1 3/2004 Ross et al. ...................... 701/33
2004/0046564 A1 3/2004 Klang ........................... 324/426
2004/0049361 A1 3/2004 Hamdan et al. .............. 702/115
2004/0051532 A1 3/2004 Smith et al. .................. 324/426
2004/0051533 A1 3/2004 Namaky ....................... 324/426
2004/0051534 A1 3/2004 Kobayashi et al. .......... 324/429
2004/0054503 A1 3/2004 Namaky ....................... 702/182
2004/0064225 A1 4/2004 Jammu et al. .................. 701/29
2004/0065489 A1 4/2004 Aberle ......................... 180/65.1
2004/0088087 A1 5/2004 Fukushima et al. ............ 701/32
2004/0104728 A1 6/2004 Bertness et al. .............. 324/429
2004/0108855 A1 6/2004 Raichle ......................... 324/378
2004/0108856 A1 6/2004 Johnson ........................ 324/426
2004/0113494 A1 6/2004 Karuppana et al.
2004/0113588 A1 6/2004 Mikuriya et al. ............. 320/128
2004/0145342 A1 7/2004 Lyon ............................ 320/108
2004/0145371 A1 7/2004 Bertness ....................... 324/426
2004/0150494 A1 8/2004 Yoshida ........................ 333/243
2004/0157113 A1 8/2004 Klang ............................. 429/50
2004/0164706 A1 8/2004 Osborne ....................... 320/116
2004/0172177 A1 9/2004 Nagai et al. .................... 701/29
2004/0178185 A1 9/2004 Yoshikawa et al. .......... 219/270
2004/0189309 A1 9/2004 Bertness et al. .............. 324/426
2004/0199343 A1 10/2004 Cardinal et al. ................ 702/63
2004/0207367 A1 10/2004 Taniguchi et al. ............ 320/149
2004/0221641 A1 11/2004 Moritsugu ................... 73/23.31
2004/0227523 A1 11/2004 Namaky ....................... 324/537
2004/0239332 A1 12/2004 Mackel et al. ................ 324/426
2004/0251876 A1 12/2004 Bertness et al. .............. 320/136
2004/0257084 A1 12/2004 Restaino ...................... 324/400
2005/0007068 A1 1/2005 Johnson et al. .............. 320/110
2005/0009122 A1 1/2005 Whelan et al. .............. 435/7.32
2005/0017726 A1 1/2005 Koran et al. .................. 324/433
2005/0017952 A1 1/2005 His .............................. 345/169
2005/0021197 A1 1/2005 Zimmerman ................ 701/31.4
2005/0021294 A1 1/2005 Trsar et al. .................. 702/183
2005/0021475 A1 1/2005 Bertness ......................... 705/63
2005/0025299 A1 2/2005 Tischer et al. ................ 379/199
2005/0035752 A1 2/2005 Bertness
2005/0043868 A1 2/2005 Mitcham ......................... 701/29
2005/0057256 A1 3/2005 Bertness ....................... 324/426
2005/0060070 A1 3/2005 Kapolka et al. ................ 701/29
2005/0073314 A1 4/2005 Bertness et al. .............. 324/433
2005/0076381 A1 4/2005 Gross ........................... 725/107
2005/0077904 A1 4/2005 Bertness
2005/0096809 A1 5/2005 Skeen et al. .................... 701/29
2005/0102073 A1 5/2005 Ingram ........................... 701/29
2005/0119809 A1 6/2005 Chen ........................... 701/33.5
2005/0128083 A1 6/2005 Puzio et al. ............... 340/572.1
2005/0128902 A1 6/2005 Tsai ........................... 369/44.32
2005/0133245 A1 6/2005 Katsuyama ................. 174/74 R
2005/0134282 A1 6/2005 Averbuch ..................... 324/426
2005/0143882 A1 6/2005 Umezawa ....................... 701/29
2005/0159847 A1 7/2005 Shah et al. .................... 700/276
2005/0162172 A1 7/2005 Bertness ....................... 324/426
2005/0168226 A1 8/2005 Quint et al. .................. 324/426
2005/0173142 A1 8/2005 Cutler et al. .................. 173/181
2005/0182536 A1 8/2005 Doyle et al. .................... 701/29
2005/0184732 A1 8/2005 Restaino ...................... 324/426
2005/0206346 A1 9/2005 Smith et al.
2005/0212521 A1 9/2005 Bertness et al. .............. 324/426
2005/0213874 A1 9/2005 Kline ............................. 385/15
2005/0218902 A1 10/2005 Restaino et al. .............. 324/433
2005/0231205 A1 10/2005 Bertness et al. .............. 324/426
2005/0254106 A9 11/2005 Silverbrook et al. ......... 358/539
2005/0256617 A1 11/2005 Cawthorne et al. ............ 701/22
2005/0258241 A1 11/2005 McNutt et al. ............... 235/385
2005/0264296 A1 12/2005 Philbrook ..................... 324/433
2005/0269880 A1 12/2005 Konishi ....................... 307/10.7
2005/0273218 A1 12/2005 Breed ............................... 701/2
2006/0012330 A1 1/2006 Okumura et al. ............ 320/103
2006/0017447 A1 1/2006 Bertness ....................... 324/538
2006/0026017 A1 2/2006 Walkder ...................... 701/31.4
2006/0030980 A1 2/2006 St. Denis ........................ 701/29
2006/0038572 A1 2/2006 Philbrook
2006/0043976 A1 3/2006 Gervais ........................ 324/508
2006/0061469 A1 3/2006 Jaeger ...................... 340/539.13
2006/0076923 A1* 4/2006 Eaves .................. G01T 1/2018 320/112
2006/0079203 A1 4/2006 Nicolini ....................... 455/411
2006/0089767 A1 4/2006 Sowa ............................. 701/29
2006/0090554 A1 5/2006 Krampitz
2006/0090555 A1 5/2006 Krampitz
2006/0091597 A1 5/2006 Opsahl
2006/0092584 A1 5/2006 Raichle
2006/0095230 A1 5/2006 Grier et al. ................... 702/183
2006/0102397 A1 5/2006 Buck ............................ 429/432
2006/0125482 A1* 6/2006 Klang ................. G01R 31/389 324/426
2006/0136119 A1 6/2006 Raichle
2006/0139167 A1 6/2006 Davie
2006/0152224 A1 7/2006 Kim et al. .................... 324/430
2006/0155439 A1 7/2006 Slawinski .................... 701/33.4

(56) References Cited

U.S. PATENT DOCUMENTS

2006/0161313 A1 7/2006 Rogers et al. .................... 701/1
2006/0161390 A1 7/2006 Namaky et al. .............. 702/183
2006/0217914 A1 9/2006 Bertness ....................... 702/113
2006/0244457 A1 11/2006 Henningson et al. ........ 324/426
2006/0282227 A1 12/2006 Bertness
2006/0282323 A1 12/2006 Walker et al. .................. 705/14
2007/0005201 A1 1/2007 Chenn .......................... 701/31.5
2007/0024460 A1 2/2007 Clark ............................ 340/663
2007/0026916 A1 2/2007 Juds et al. ........................ 463/1
2007/0046261 A1 3/2007 Porebski ....................... 320/132
2007/0082652 A1 4/2007 Hartigan
2007/0088472 A1 4/2007 Ganzhorn et al. .............. 701/33
2007/0108942 A1 5/2007 Johnson et al. .............. 320/112
2007/0159177 A1 7/2007 Bertness et al. .............. 324/426
2007/0182576 A1 8/2007 Proska et al. .............. 340/636.1
2007/0194791 A1 8/2007 Huang .......................... 324/430
2007/0194793 A1 8/2007 Bertness ....................... 324/503
2007/0205752 A1 9/2007 Leigh ............................ 324/500
2007/0205983 A1 9/2007 Naimo .......................... 345/160
2007/0210801 A1 9/2007 Krampitz ...................... 324/426
2007/0244660 A1 10/2007 Bertness
2007/0259256 A1 11/2007 Le Canut et al. .............. 429/90
2007/0279066 A1 12/2007 Chism ........................... 324/437
2008/0023547 A1 1/2008 Raichle .................... 235/462.13
2008/0036421 A1 2/2008 Seo .............................. 320/132
2008/0053716 A1 3/2008 Scheucher ..................... 180/2.1
2008/0059014 A1 3/2008 Nasr et al. ...................... 701/22
2008/0064559 A1 3/2008 Cawthorne ....................... 477/5
2008/0086246 A1 4/2008 Bolt et al. ....................... 701/29
2008/0094068 A1 4/2008 Scott ............................ 324/426
2008/0103656 A1 5/2008 Lipscomb .................... 701/33.4
2008/0106267 A1 5/2008 Bertness ....................... 320/112
2008/0169818 A1 7/2008 Lesesky et al. .............. 324/426
2008/0179122 A1 7/2008 Sugawara ................ 180/65.245
2008/0194984 A1 8/2008 Keefe .......................... 600/559
2008/0249724 A1 10/2008 Jin et al.
2008/0303528 A1 12/2008 Kim ............................. 324/430
2008/0303529 A1 12/2008 Nakamura et al. ........... 324/433
2008/0315830 A1 12/2008 Bertness ....................... 320/104
2009/0006476 A1 1/2009 Andreasen et al. ....... 707/104.1
2009/0011327 A1 1/2009 Okumura et al. .............. 429/99
2009/0013521 A1 1/2009 Okumura et al. .............. 29/730
2009/0024266 A1 1/2009 Bertness ......................... 701/22
2009/0024419 A1 1/2009 McClellan ........................ 705/4
2009/0085571 A1 4/2009 Bertness ....................... 324/426
2009/0128011 A1 5/2009 Miyazaki et al.
2009/0146800 A1 6/2009 Grimlund et al. ............ 340/505
2009/0160395 A1 6/2009 Chen ............................ 320/101
2009/0198372 A1 8/2009 Hammerslag ................. 700/226
2009/0203247 A1 8/2009 Fifelski ......................... 439/345
2009/0237029 A1 9/2009 Andelfinger .................. 320/108
2009/0237086 A1 9/2009 Andelfinger .................. 324/431
2009/0247020 A1 10/2009 Gathman et al. ............. 439/759
2009/0259432 A1 10/2009 Liberty ......................... 702/150
2009/0265121 A1 10/2009 Rocci ............................. 702/57
2009/0276115 A1 11/2009 Chen .............................. 701/32
2009/0311919 A1 12/2009 Smith ........................... 439/759
2010/0023198 A1 1/2010 Hamilton ........................ 701/29
2010/0039065 A1 2/2010 Kinkade ....................... 320/104
2010/0052193 A1 3/2010 Sylvester ......................... 261/26
2010/0066283 A1 3/2010 Kitanaka .................. 318/400.02
2010/0088050 A1 4/2010 Keuss ............................. 702/63
2010/0117603 A1 5/2010 Makhija ........................ 320/162
2010/0145780 A1 6/2010 Nishikawa et al. ....... 705/14.11
2010/0214055 A1 8/2010 Fuji ............................... 340/3.1
2010/0265131 A1 10/2010 Fabius
2010/0314950 A1 12/2010 Rutkowski et al. .......... 307/125
2011/0004427 A1 1/2011 Gorbold et al. ................ 702/63
2011/0015815 A1 1/2011 Bertness ......................... 701/22
2011/0106280 A1 5/2011 Zeier .............................. 700/90
2011/0161025 A1 6/2011 Tomura ........................... 702/63
2011/0215767 A1 9/2011 Johnson et al. .............. 320/136
2011/0218747 A1 9/2011 Bertness ......................... 702/63
2011/0265025 A1 10/2011 Bertness
2011/0267067 A1 11/2011 Bertness et al.
2011/0273181 A1 11/2011 Park et al. .................... 324/429
2011/0294367 A1 12/2011 Moon ........................... 439/878
2011/0300416 A1 12/2011 Bertness
2012/0041697 A1 2/2012 Stukenberg ..................... 702/63
2012/0046807 A1 2/2012 Ruther .............................. 701/2
2012/0046824 A1 2/2012 Ruther et al. ................ 701/31.5
2012/0062237 A1* 3/2012 Robinson ........... G01R 31/3631 324/433
2012/0074904 A1 3/2012 Rutkowski et al. .......... 320/112
2012/0086399 A1* 4/2012 Choi ..................... H02J 7/0016 320/116
2012/0116391 A1 5/2012 Houser ........................... 606/41
2012/0182132 A1 7/2012 McShane
2012/0249069 A1 10/2012 Ohtomo ........................ 320/109
2012/0256494 A1 10/2012 Kesler ........................... 307/104
2012/0256568 A1 10/2012 Lee ............................... 318/139
2012/0274331 A1 11/2012 Liu ............................... 324/426
2012/0293372 A1 11/2012 Amendolare ................. 342/451
2013/0099747 A1 4/2013 Baba ............................ 310/118
2013/0115821 A1 5/2013 Golko ........................... 439/638
2013/0158782 A1 6/2013 Bertness et al. ............. 701/34.4
2013/0172019 A1 7/2013 Youssef ..................... 455/456.6
2013/0218781 A1 8/2013 Simon
2013/0288706 A1 10/2013 Yu ............................. 455/456.1
2013/0297247 A1 11/2013 Jardine
2013/0311124 A1 11/2013 Van Bremen
2013/0314041 A1 11/2013 Proebstle ...................... 320/109
2013/0325405 A1 12/2013 Miller
2014/0002021 A1 1/2014 Bertness
2014/0002094 A1 1/2014 Champlin ..................... 324/426
2014/0029308 A1 1/2014 Cojocaru ........................ 363/13
2014/0081527 A1 3/2014 Miller
2014/0099830 A1 4/2014 Byrne ........................... 439/638
2014/0117997 A1 5/2014 Bertness
2014/0194084 A1 7/2014 Noonan ..................... 455/404.1
2014/0225622 A1 8/2014 Kudo ............................ 324/433
2014/0239964 A1 8/2014 Gach ............................ 324/433
2014/0260577 A1 9/2014 Chinnadurai
2014/0266061 A1 9/2014 Wachal
2014/0278159 A1 9/2014 Chinnadurai
2014/0354237 A1 12/2014 Cotton
2015/0093922 A1 4/2015 Bosscher ........................ 439/39
2015/0115720 A1 4/2015 Hysell ............................. 307/65
2015/0166518 A1 6/2015 Boral et al.
2015/0168499 A1 6/2015 Palmisano
2015/0221135 A1 8/2015 Hill ............................... 345/633
2016/0011271 A1 1/2016 Bertness
2016/0091571 A1 3/2016 Salo, III
2016/0154044 A1 6/2016 Bertness
2016/0171799 A1 6/2016 Bertness
2016/0216335 A1 7/2016 Bertness
2016/0238667 A1 8/2016 Palmisano et al.
2016/0253852 A1 9/2016 Bertness et al.
2016/0266212 A1 9/2016 Carlo
2016/0285284 A1 9/2016 Matlapudi et al.
2016/0321897 A1 11/2016 Lee
2016/0336623 A1 11/2016 Nayar
2017/0093056 A1 3/2017 Salo, III et al.
2017/0146602 A1 5/2017 Samp
2017/0373410 A1 12/2017 Lipkin et al.
2018/0113171 A1 4/2018 Bertness
2018/0306867 A1 10/2018 Bertness

FOREIGN PATENT DOCUMENTS

CN 103091633 5/2013
DE 29 26 716 B1 1/1981
DE 40 07 883 9/1991
DE 196 38 324 9/1996
DE 10 2008 036 595 A1 2/2010
EP 0 022 450 A1 1/1981
EP 0 391 694 A2 4/1990
EP 0 476 405 A1 9/1991
EP 0 637 754 A1 2/1995
EP 0 772 056 A1 5/1997
EP 0 982 159 A2 3/2000
EP 1 810 869 A1 11/2004
EP 1 786 057 5/2007
EP 1 807 710 B1 7/2007

(56) References Cited

FOREIGN PATENT DOCUMENTS

| | | | |
|---|---|---|---|
| EP | 1 807 710 | | 1/2010 |
| EP | 2 302 724 | | 3/2011 |
| FR | 2 749 397 | | 12/1997 |
| GB | 154 016 | | 11/1920 |
| GB | 2 029 586 | | 3/1980 |
| GB | 2 088 159 | A | 6/1982 |
| GB | 2 246 916 | A | 10/1990 |
| GB | 2 275 783 | A | 7/1994 |
| GB | 2 353 367 | | 2/2001 |
| GB | 2 387 235 | A | 10/2003 |
| JP | 59-17892 | | 1/1984 |
| JP | 59-17893 | | 1/1984 |
| JP | 59017894 | | 1/1984 |
| JP | 59215674 | | 12/1984 |
| JP | 60225078 | | 11/1985 |
| JP | 62-180284 | | 8/1987 |
| JP | 63027776 | | 2/1988 |
| JP | 03274479 | | 12/1991 |
| JP | 03282276 | | 12/1991 |
| JP | 4-8636 | | 1/1992 |
| JP | 04095788 | | 3/1992 |
| JP | 04131779 | | 5/1992 |
| JP | 04372536 | | 12/1992 |
| JP | 05211724 | A | 8/1993 |
| JP | 5216550 | | 8/1993 |
| JP | 7-128414 | | 5/1995 |
| JP | 09061505 | | 3/1997 |
| JP | 10056744 | | 2/1998 |
| JP | 10232273 | | 9/1998 |
| JP | 11103503 | A | 4/1999 |
| JP | 11-150809 | | 6/1999 |
| JP | 11-271409 | | 10/1999 |
| JP | 2001-023037 | | 1/2001 |
| JP | 2001057711 | A | 2/2001 |
| JP | 2003-346909 | | 12/2003 |
| JP | 2005-238969 | | 9/2005 |
| JP | 2006331976 | A | 12/2006 |
| JP | 2009-244166 | | 10/2009 |
| JP | 2009-261174 | | 11/2009 |
| JP | 2010-172122 | | 5/2010 |
| JP | 2010-172142 | | 8/2010 |
| RU | 2089015 | C1 | 8/1997 |
| WO | WO 93/22666 | | 11/1993 |
| WO | WO 94/05069 | | 3/1994 |
| WO | WO 96/01456 | | 1/1996 |
| WO | WO 96/06747 | | 3/1996 |
| WO | WO 96/28846 | | 9/1996 |
| WO | WO 97/01103 | | 1/1997 |
| WO | WO 97/44652 | | 11/1997 |
| WO | WO 98/04910 | | 2/1998 |
| WO | WO 98/21132 | | 5/1998 |
| WO | WO 98/58270 | | 12/1998 |
| WO | WO 99/23738 | | 5/1999 |
| WO | WO 99/56121 | | 11/1999 |
| WO | WO 00/16083 | | 3/2000 |
| WO | WO 00/62049 | | 10/2000 |
| WO | WO 00/67359 | | 11/2000 |
| WO | WO 01/59443 | | 2/2001 |
| WO | WO 01/16614 | | 3/2001 |
| WO | WO 01/16615 | | 3/2001 |
| WO | WO 01/51947 | | 7/2001 |
| WO | WO 03/047064 | A3 | 6/2003 |
| WO | WO 03/076960 | A1 | 9/2003 |
| WO | WO 2004/047215 | A1 | 6/2004 |
| WO | WO 2007/075403 | | 7/2007 |
| WO | WO 2009/004001 | | 1/2009 |
| WO | WO 2010/007681 | | 1/2010 |
| WO | WO 2010/035605 | | 4/2010 |
| WO | WO 2010/042517 | | 4/2010 |
| WO | WO 2011/153419 | | 12/2011 |
| WO | WO 2013/070850 | | 5/2013 |

OTHER PUBLICATIONS

"Battery Impedance", by E. Willihnganz et al., *Electrical Engineering*, Sep. 1959, pp. 922-925.

"Determining the End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem*., 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice for Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"JIS Japanese Industrial Standard—Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc*., Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

National Semiconductor Corporation, "High Q Notch Filter", Mar. 1969, Linear Brief 5, Mar. 1969.

Burr-Brown Corporation, "Design a 60 Hz Notch Filter with the UAF42", Jan. 1994, AB-071, 1994.

National Semiconductor Corporation, "LMF90-4$^{th}$-Order Elliptic Notch Filter", Dec. 1994, RRD-B30M115, Dec. 1994.

"Alligator Clips with Wire Penetrators" *J.S. Popper, Inc.* product information, downloaded from http://www.jspopper.com/, prior to Oct. 1, 2002.

"#12: LM78S40 Simple Switcher DC to DC Converter", *ITM e-Catalog*, downloaded from http://www.pcbcafe.com, prior to Oct. 1, 2002.

"Simple DC-DC Converts Allows Use of Single Battery", *Electronix Express*, downloaded from http://www.elexp.com/t_dc-dc.htm, prior to Oct. 1, 2002.

"DC-DC Converter Basics", *Power Designers*, downloaded from http://www.powederdesigners.com/InforWeb.design_center/articles/DC-DC/converter.shtm, prior to Oct. 1, 2002.

"Notification of Transmittal of the International Search Report or the Declaration", PCT/US02/29461, filed Sep. 17, 2002 and dated Jan. 3, 2003.

"Notification of Transmittal of the International Search Report or the Declaration", PCT/US03/07546, filed Mar. 13, 2003 and dated Jul. 4, 2001.

"Notification of Transmittal of the International Search Report or the Declaration", PCT/US03/06577, filed Mar. 5, 2003 and dated Jul. 24, 2003.

"Notification of Transmittal of the International Search Report or the Declaration", PCT/US03/07837, filed Mar. 14, 2003 and dated Jul. 4, 2003.

"Improved Impedance Spectroscopy Technique for Status Determination of Production Li/$SO_2$ Batteries" Terrill Atwater et al., pp. 10-113, (1992).

"Notification of Transmittal of the International Search Report or the Declaration", PCT/US03/41561; Search Report completed Apr. 13, 2004, dated May 6, 2004.

"Notification of Transmittal of the International Search Report or the Declaration", PCT/US03/27696, filed Sep. 4, 2003 and dated Apr. 15, 2004.

(56) References Cited

OTHER PUBLICATIONS

"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois pp. 1-1-14-13, (1991).
Supplementary European Search Report Communication for Appl. No. 99917402.2; dated Sep. 7, 2004.
"Dynamic modelling of lead/acid batteries using impedance spectroscopy for parameter identification", Journal of Power Sources, pp. 69-84, (1997).
Notification of Transmittal of the International Search Report for PCT/US03/30707, filed Sep. 30, 2003 and dated Nov. 24, 2004.
"A review of impedance measurements for determination of the state-of-charge or state-of-health of secondary batteries", Journal of Power Sources, pp. 59-69, (1998).
"Search Report Under Section 17" for Great Britain Application No. GB0421447.4, date of search Jan. 27, 2005, date of document Jan. 28, 2005.
"Results of Discrete Frequency Immittance Spectroscopy (DFIS) Measurements of Lead Acid Batteries", by K.S. Champlin et al., *Proceedings of 23rd International Teleco Conference (INTELEC)*, published Oct. 2001, IEE, pp. 433-440.
"Examination Report" from the UK Patent Office for App. No. 0417678.0; dated Jan. 24, 2005.
Wikipedia Online Encyclopedia, Inductance, 2005, http://en.wikipedia.org/wiki/inductance, pp. 1-5, mutual Inductance, pp. 3,4.
"Professional BCS System Analyzer Battery-Charger-Starting", pp. 2-8, (2001).
Young Illustrated Encyclopedia Dictionary of Electronics, 1981, Parker Publishing Company, Inc., pp. 318-319.
"DSP Applications in Hybrid Electric Vehicle Powertrain", Miller et al., Proceedings of the American Control Conference, Sand Diego, CA, Jun. 1999; 2 ppg.
"Notification of Transmittal of the International Search Report and the Written Opinion of the International Searching Authority, or the Declaration" for PCT/US2008/008702 filed Jul. 2008; 15 pages.
"A Microprocessor-Based Control System for a Near-Term Electric Vehicle", Bimal K. Bose; IEEE Transactions on Industry Applications, vol. IA-17, No. 6, Nov./Dec. 1981; 0093-9994/81/1100-0626$00.75 © 1981 IEEE, 6 pages.
Notification of Transmittal of the International Search Report and the Written Opinion of the International Searching Authority, or the Declaration for PCT/US2011/038279 filed May 27, 2011, dated Sep. 16, 2011, 12 pages.
U.S. Appl. No. 60/387,912, filed Jun. 13, 2002 which is related to U.S. Pat. No. 7,089,127.
"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).
"Field and Laboratory Studies to Assess the State of Health of Valve-Regulated Lead Acid Batteries: Part I—Conductance/Capacity Correlation Studies", by D. Feder at al., Oct. 1992, pp. 1-15; (19 total pgs.).
"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).
"Conductance Testing of Standby Batteries in Signaling and Communications Applications for the Purpose of Evaluating Battery State-of-Health", by S. McShane, Apr. 1993, pp. 1-9; (14 total pgs.).
"Condutance Monitoring of Recombination Lead Acid Batteries", by B. Jones, May 1993, pp. 1-6; (11 total pgs.).
"Evaluating the State-of-Health of Lead Acid Flooded and Valve-Regulated Batteries: A Comparison of Conductance Testing vs. Traditional Methods", by M. Hlavac et al., Jun. 1993, pp. 1-15; (20 total pgs.).
"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).
"Field and Laboratory Studies to Access the State-of-Health of Valve-Regulated Lead-Acid Battery Technologies Using Conductance Testing Part II—Further Conductance/Capacity Correlation Studies", by M. Hlavac et al., Sep. 1993, pp. 1-9; (14 total pgs.).
"Field Experience of Testing VRLA Batteries by Measuring Conductance", by M.W. Kniveton, May 1994, pp. 1-4; (9 total pgs.).
"Reducing the Cost of Maintaining VRLA Batteries in Telecom Applications", by M.W. Kniveton, Sep. 1994, pp. 1-5; (10 total pgs.).
"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).
"Testing 24 Volt Aircraft Batteries Using Midtronics Conductance Technology", by M. Hlavac et al., Jan. 1995, 9 pgs; (13 total pgs.).
"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).
"VRLA Battery Conductance Monitoring Part V: Strategies for VRLA Battery Testing and Monitoring in Telecom Operating Environments", by M. Hlavac et al., Oct. 1996, 9 pgs; (13 total pgs.).
"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).
"Impedance/Conductance Measurements as an Aid to Determining Replacement Strategies", M. Kniveton, Sep. 1998, pp. 297-301; (9 total pgs.).
"A Fundamentally New Approach to Battery Performance Analysis Using DFRA™/DTIS™ Technology", by K. Champlin et al., Sep. 2000, 8 pgs; (12 total pgs.).
"Battery State of Health Monitoring, Combining Conductance Technology With Other Measurement Parameters for Real-Time Battery Performance Analysis", by D. Cox et la., Mar. 2000, 6 pgs; (10 total pgs.).
Search Report and Written Opinion from PCT Application No. PCT/US2011/026608, dated Aug. 29, 2011, 9 pgs.
Examination Report under section 18(3) for corresponding Great Britain Application No. GB1000773.0, dated Feb. 6, 2012, 2 pages.
Communication from GB1216105.5, dated Sep. 21, 2012.
Notification of Transmittal of the International Search Report and Written Opinion from PCT/US2011/039043, dated Jul. 26, 2012.
Notification of Transmittal of the International Search Report and Written Opinion from PCT/US2011/053886, dated Jul. 27, 2012.
Search Report from PCT/US2011/047354, dated Nov. 11, 2011.
Written Opinion from PCT/US2011/047354, dated Nov. 11, 2011.
First Office Action (Notification of Reasons for Rejections) dated Dec. 3, 2013 in related Japanese patent application No. 2013-513370, 9 pgs. Including English Translation.
Official Action dated Jan. 22, 2014 in Korean patent application No. 10-2012-7033020, 2 pgs including English Translation.
Official Action dated Feb. 20, 2014 in Korean patent application No. 10-2013-7004814, 6 pgs including English Translation.
First Office Action for Chinese Patent Application No. 201180011597.4, dated May 6, 2014, 20 pages.
Office Action from Korean Application No. 10/2012-7033020, dated Jul. 29, 2014.
Office Action for Chinese Patent Application No. 201180038844.X, dated Jul. 1, 2014.
Office Action for Chinese Patent Application No. 201180030045.8, dated Jul. 21, 2014.
Office Action for German Patent Application No. 1120111030643 dated Aug. 28, 2014.
Office Action from Japanese Patent Application No. 2013-513370, dated Aug. 5, 2014.
Office Action from Japanese Patent Application No. 2013-531839, dated Jul. 8, 2014.

(56) References Cited

OTHER PUBLICATIONS

Office Action for German Patent Application No. 103 32 625.1, dated Nov. 7, 2014, 14 pages.
Office Action from Chinese Patent Application No. 201180038844.X, dated Dec. 8, 2014.
Office Action from CN Application No. 201180011597.4, dated Jan. 6, 2015.
"Field Evaluation of Honda's EV PLUS Battery Packs", by A. Paryani, *IEEE AES Systems Magazine*, Nov. 2000, pp. 21-24.
Notification of Transmittal of the International Search Report and the Written Opinion of the International Searching Authority, or the Declaration dated Sep. 26, 2013 for International Appln. No. PCT/US2012/064064, filed Nov. 8, 2012.
Office Action for Chinese Patent Application No. 201180030045.8, dated Mar. 24, 2015.
Office Action for Japanese Patent Application No. 2013-531839, dated Mar. 31, 2015.
Notification of Transmittal of the International Search Report and Written Opinion from PCT/US2014/069661, dated Mar. 26, 2015.
Office Action for Chinese Patent Application No. 201180038844.X, dated Jun. 8, 2015.
Office Action from Chinese Patent Application No. 201180011597.4 dated Jun. 3, 2015.
European Search Report from European Application No. EP 15151426.2, dated Jun. 1, 2015.
Notification of Transmittal of the International Search Report and the Written Opinion from PCT/US2016/014867, dated Jun. 3, 2016.
Office Action from Japanese Patent Application No. 2015-014002, dated Jul. 19, 2016.
Notification of Transmittal of the International Search Report and the Written Opinion of the International Searching Authority from PCT/US2016/02696, dated Aug. 24, 2016.
Office Action from German Patent Application No. 10393251.8, dated Nov. 4, 2016, including English translation.
Office Action from European Patent Application No. 15 151 426.2-1801, dated Aug. 28, 2017, 2 pages.
Office Action from German Patent Application No. 112011101892.4, dated Sep. 7, 2017.
Office Action from Japanese Patent Application No. 2017-026740, dated Jan. 9, 2018.
U.S. Appl. No. 12/697,485, filed Feb. 1, 2010, 36 pgs.
Office Action from Chinese Patent Application No. 201480066251.8, dated May 29, 2018.
Brochure: "Sensors Intelligent Battery Sensors, Measuring Battery Capacity and Ageing", by Hella, 6 pgs.
Office Action from Japanese Patent Application No. 2017-026740, dated May 8, 2018.

* cited by examiner

BATTERY PACK TESTER

CROSS-REFERENCE TO RELATED APPLICATION

The present application is based on and claims the benefit of U.S. provisional patent application Ser. No. 61/558,088, filed Nov. 10, 2011, the content of which is hereby incorporated by reference in its entirety.

BACKGROUND

The present invention relates to storing batteries, and in particular, battery packs for storing electricity. Such packs have many applications including power supplies, temporary power generating equipment, electrical vehicles including both hybrid and purely electric vehicles. More specifically, the present invention relates to the maintenance of such battery packs.

Battery packs are used to store electricity. Battery packs which consist of a plurality of batteries. These batteries may be formed by a number of individual batteries or may themselves be individual cells depending on the configuration of the battery and battery pack. The packs are often large and replacement can be expensive. Such packs are in electric vehicles, backup power sources for cellular phone sites, power sub stations, etc.

When testing a battery within the battery pack, it is often necessary to disconnect the battery from the battery pack in order to obtain accurate test results. This is time consuming and requires a significant amount of "down time" during which the battery is disconnected, tested and then reconnected.

SUMMARY

An apparatus and method for testing a battery pack are provided. Measurement circuitry is configured to measure parameters of batteries within the battery pack. The measurement circuitry responsively provides an output indicative of a condition of a battery in the battery pack. The output is based upon a measured parameter of the battery pack and a correction factor.

DETAILED DESCRIPTION OF ILLUSTRATIVE EMBODIMENTS

Figure 1:
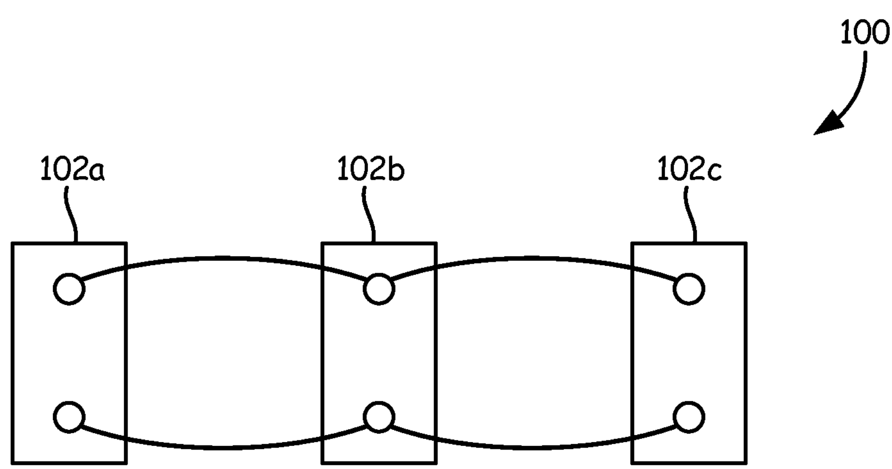
FIG. 1 is a simplified diagram of a battery pack with three storage batteries connected in parallel.

As discussed in the Background section, battery packs are used in various applications to store large amounts of energy. A plurality of batteries are coupled together to form a battery pack having a capacity which is greater than a single battery within the pack. Various technologies are known for performing tests and maintenance on storage batteries. For example, Midtronics and Dr. Keith S. Champlin have pioneered this field as described in U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Pat. No. 5,572,136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov. 3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No. 6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259, 254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S. Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. Nos. 6,456,045; 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002; U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,707,303, issued Mar. 16, 2004; U.S. Pat. No. 6,737,831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S. Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued Mar. 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 200; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb. 21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208,914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Pat. No. 7,363,175, issued Apr. 22, 2008; U.S. Pat. No. 7,398,176, issued Jul. 8, 2008; U.S. Pat. No. 7,408,358, issued Aug. 5, 2008; U.S. Pat. No. 7,425,833, issued Sep. 16, 2008; U.S. Pat. No. 7,446,536, issued Nov. 4, 2008; U.S. Pat. No. 7,479,763, issued Jan. 20, 2009; U.S. Pat. No. 7,498,767, issued Mar. 3, 2009; U.S. Pat. No. 7,501,795, issued Mar. 10, 2009; U.S. Pat. No. 7,505,856, issued Mar. 17, 2009; U.S. Pat. No. 7,545,146, issued Jun. 9, 2009; U.S. Pat. No. 7,557,586, issued Jul. 7, 2009; U.S. Pat. No. 7,595,643, issued Sep. 29, 2009; U.S. Pat. No. 7,598,699, issued Oct. 6, 2009; U.S. Pat. No. 7,598,744, issued Oct. 6, 2009; U.S. Pat. No. 7,598,743, issued Oct. 6, 2009; U.S. Pat. No. 7,619,417, issued Nov. 17, 2009; U.S. Pat. No. 7,642,786, issued Jan. 5, 2010; U.S. Pat. No. 7,642,787, issued Jan. 5, 2010; U.S. Pat. No. 7,656,162, issued Feb. 2, 2010; U.S. Pat. No. 7,688,074, issued Mar. 30, 2010; U.S. Pat. No. 7,705,602, issued Apr. 27, 2010; U.S. Pat. No. 7,706,992, issued Apr. 27, 2010; U.S. Pat. No. 7,710,119, issued May 4, 2010; U.S. Pat. No. 7,723,993, issued May 25, 2010; U.S. Pat. No. 7,728,597, issued Jun. 1, 2010; U.S. Pat. No. 7,772,850, issued Aug. 10, 2010; U.S. Pat. No. 7,774,151, issued Aug. 10, 2010; U.S. Pat. No. 7,777,612, issued Aug. 17, 2010; U.S. Pat. No. 7,791,348, issued Sep. 7, 2010; U.S. Pat. No. 7,808,375, issued Oct. 5, 2010; U.S. Pat. No. 7,924,015, issued Apr. 12, 2011; U.S. Pat. No. 7,940,053, issued May 10, 2011; U.S. Pat. No. 7,940,052, issued May 10, 2011; U.S. Pat. No. 7,959,476, issued Jun. 14, 2011; U.S. Pat. No. 7,977,914, issued Jul. 12, 2011; U.S. Pat. No. 7,999,505, issued Aug. 16, 2011; U.S. Pat. No. D643,759, issued Aug. 23, 2011; U.S. Pat. No. 8,164,343, issued Apr. 24, 2012; U.S. Pat. No. 8,198,900, issued Jun. 12, 2012; U.S. Pat. No. 8,203,345, issued Jun. 19, 2012; U.S. Pat. No. 8,237,448, issued Aug. 7, 2012; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 10/042,451, filed Jan. 8, 2002, entitled BATTERY CHARGE CONTROL DEVICE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,998, filed Mar. 29, 2002, entitled BATTERY TESTER WITH BATTERY REPLACEMENT OUTPUT; U.S. Ser. No. 10/263,473, filed Oct. 2, 2002, entitled ELECTRONIC BATTERY TESTER WITH RELATIVE TEST OUTPUT; U.S. Ser. No. 10/310,385, filed Dec. 5, 2002, entitled BATTERY TEST MODULE; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/681,666, filed Oct. 8, 2003, entitled ELECTRONIC BATTERY TESTER WITH PROBE LIGHT; U.S. Ser. No. 10/867,385, filed Jun. 14, 2004, entitled ENERGY MANAGEMENT SYSTEM FOR AUTOMOTIVE VEHICLE; U.S. Ser. No. 10/958,812, filed Oct. 5, 2004, entitled SCAN TOOL FOR ELECTRONIC BATTERY TESTER; U.S. Ser. No. 60/587,232, filed Dec. 14, 2004, entitled CELLTRON ULTRA, U.S. Ser. No. 60/653,537, filed Feb. 16, 2005, entitled CUSTOMER MANAGED WARRANTY CODE; U.S. Ser. No. 60/665,070, filed Mar. 24, 2005, entitled OHMMETER PROTECTION CIRCUIT; U.S. Ser. No. 60,694,199, filed Jun. 27, 2005, entitled GEL BATTERY CONDUCTANCE COMPENSATION; U.S. Ser. No. 60/705,389, filed Aug. 4, 2005, entitled PORTABLE TOOL THEFT PREVENTION SYSTEM, U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 60/712,322, filed Aug. 29, 2005, entitled AUTOMOTIVE VEHICLE ELECTRICAL SYSTEM DIAGNOSTIC DEVICE, U.S. Ser. No. 60/713,168, filed Aug. 31, 2005, entitled LOAD TESTER SIMULATION WITH DISCHARGE COMPENSATION, U.S. Ser. No. 60/731,881, filed Oct. 31, 2005, entitled PLUG-IN FEATURES FOR BATTERY TESTERS; U.S. Ser. No. 60/731,887, filed Oct. 31, 2005, entitled AUTOMOTIVE VEHICLE ELECTRICAL SYSTEM DIAGNOSTIC DEVICE; U.S. Ser. No. 11/304,004, filed Dec. 14, 2005, entitled BATTERY TESTER THAT CALCULATES ITS OWN REFERENCE VALUES; U.S. Ser. No. 60/751,853, filed Dec. 20, 2005, entitled BATTERY MONITORING SYSTEM; U.S. Ser. No. 11/304,004, filed Dec. 14, 2005, entitled BATTERY TESTER WITH CALCULATES ITS OWN REFERENCE VALUES; U.S. Ser. No. 60/751,853, filed Dec. 20, 2005, entitled BATTERY MONITORING SYSTEM; U.S. Ser. No. 11/356,443, filed Feb. 16, 2006, entitled ELECTRONIC BATTERY TESTER WITH NETWORK COMMUNICATION; U.S. Ser. No. 11/519,481, filed Sep. 12, 2006, entitled BROAD-BAND LOW-CONDUCTANCE CABLES FOR MAKING KELVIN CONNECTIONS TO ELECTROCHEMICAL CELLS AND BATTERIES; U.S. Ser. No. 60/847,064, filed Sep. 25, 2006, entitled STATIONARY BATTERY MONITORING ALGORITHMS; U.S. Ser. No. 11/641,594, filed Dec. 19, 2006, entitled METHOD AND APPARATUS FOR MEASURING A PARAMETER OF A VEHICLE ELECTRONIC SYSTEM; U.S. Ser. No. 60/950,182, filed Jul. 17, 2007, entitled BATTERY TESTER FOR HYBRID VEHICLE; U.S. Ser. No. 60/973,879, filed Sep. 20, 2007, entitled ELECTRONIC BATTERY TESTER FOR TESTING STATIONARY BATTERIES; U.S. Ser. No. 60/992,798, filed Dec. 6, 2007, entitled STORAGE BATTERY AND BATTERY TESTER; U.S. Ser. No. 61/061,848, filed Jun. 16, 2008, entitled KELVIN CLAMP FOR ELECTRONICALLY COUPLING TO A BATTERY CONTACT; U.S. Ser. No. 12/174,894, filed Jul. 17, 2008, entitled BATTERY TESTER FOR ELECTRIC VEHICLE; U.S. Ser. No. 12/204,141, filed Sep. 4, 2008, entitled ELECTRONIC BATTERY TESTER OR CHARGER WITH DATABUS CONNECTION; U.S. Ser. No. 12/416,457, filed Apr. 1, 2009, entitled SYSTEM FOR AUTOMATICALLY GATHERING BATTERY INFORMATION; U.S. Ser. No. 12/416,453, filed Apr. 1, 2009, entitled INTEGRATED TAG READER AND ENVIRONMENT SENSOR; U.S. Ser. No. 12/416,445, filed Apr. 1, 2009, entitled SIMPLIFICATION OF INVENTORY MANAGEMENT; U.S. Ser. No. 12/498,642, filed Jul. 7, 2009, entitled ELECTRONIC BATTERY TESTER; U.S. Ser. No. 12/697,485, filed Feb. 1, 2010, entitled ELECTRONIC BATTERY TESTER; U.S. Ser. No. 12/712,456, filed Feb. 25, 2010, entitled METHOD AND APPARATUS FOR DETECTING CELL DETERIORATION IN AN ELECTROCHEMICAL CELL OR BATTERY; U.S. Ser. No. 61/311,485, filed Mar. 8, 2010, entitled BATTERY TESTER WITH DATABUS FOR COMMUNICATING WITH VEHICLE ELECTRICAL SYSTEM; U.S. Ser. No. 61/313,893, filed Mar. 15, 2010, entitled USE OF BATTERY MANUFACTURE/SELL DATE IN DIAGNOSIS AND RECOVERY OF DISCHARGED BATTERIES; U.S. Ser. No. 12/758,407, filed Apr. 12, 2010, entitled ELECTRONIC BATTERY TESTER WITH NETWORK COMMUNICATION; U.S. Ser. No. 12/765,323, filed Apr. 22, 2010, entitled AUTOMOTIVE VEHICLE ELECTRICAL SYSTEM DIAGNOSTIC DEVICE; U.S. Ser. No. 12/769,911, filed Apr. 29, 2010, entitled STATIONARY BATTERY TESTER; U.S. Ser. No. 61/330,497, filed May 3, 2010, entitled MAGIC WAND WITH ADVANCED HARNESS DETECTION; U.S. Ser. No. 61/348,901, filed May 27, 2010, entitled ELECTRONIC BATTERY TESTER; U.S. Ser. No. 61/351,017, filed Jun. 3, 2010, entitled IMPROVED ELECTRIC VEHICLE AND HYBRID ELECTRIC VEHICLE BATTERY MODULE BALANCER; U.S. Ser. No. 12/818,290, filed Jun. 18, 2010, entitled BATTERY MAINTENANCE DEVICE WITH THERMAL BUFFER; U.S. Ser. No. 61/373,045, filed Aug. 12, 2010, entitled ELECTRONIC BATTERY TESTER FOR TESTING STATIONERY STORAGE BATTERY; U.S. Ser. No. 12/888,689, filed Sep. 23, 2010, entitled BATTERY TESTER FOR ELECTRIC VEHICLE; U.S. Ser. No. 12/894,951, filed Sep. 30, 2010, entitled BATTERY PACK MAINTENANCE FOR ELECTRIC VEHICLES; U.S. Ser. No. 61/411,162, filed Nov. 8, 2010, entitled ELECTRONIC BATTERY TESTER; U.S. Ser. No. 13/037,641, filed Mar. 1, 2011, entitled MONITOR FOR FRONT TERMINAL BATTERIES; U.S. Ser. No. 13/037,641, filed Mar. 1, 2011, entitled: MONITOR FOR FRONT TERMINAL BATTERIES; U.S. Ser. No. 13/048,365, filed Mar. 15, 2011, entitled ELECTRONIC BATTERY TESTER WITH BATTERY AGE UNIT; U.S. Ser. No. 13/098,661, filed May 2, 2011, entitled METHOD AND APPARATUS FOR MEASURING A PARAMETER OF A VEHICLE ELECTRICAL SYSTEM; U.S. Ser. No. 13/113,272, filed May 23, 2011, entitled ELECTRONIC STORAGE BATTERY DIAGNOSTIC SYSTEM; U.S. Ser. No. 13/152,711, filed Jun. 3, 2011, entitled BATTERY PACK MAINTENANCE FOR ELECTRIC VEHICLE; U.S. Ser. No. 13/205,949, filed Aug. 9, 2011, entitled ELECTRONIC BATTE4RY TESTER FOR TESTING STORAGE BATTERY; U.S. Ser. No. 13/205,904, filed Aug. 9, 2011, entitled IN-VEHICLE BATTERY MONITOR; U.S. Ser. No. 13/270,828, filed Oct. 11, 2011, entitled SYSTEM FOR AUTOMATICALLY GATHERING BATTERY INFORMATION; U.S. Ser. No. 13/276,639, filed Oct. 19, 2011, entitled METHOD AND APPARATUS FOR MEASURING A PARAMETER OF A VEHICLE ELECTRICAL SYSTEM; U.S. Ser. No. 61/558,088, filed Nov. 10, 2011, entitled BATTERY PACK TESTER; U.S. Ser. No. 13/357,306, filed Jan. 24, 2012, entitled STORAGE BATTERY AND BATTERY TESTER; U.S. Ser. No. 29/420,688, filed May 11, 2012, entitled ELECTRONIC BATTERY TESTER; U.S. Ser. No. 61/665,555, filed Jun. 28, 2012, entitled HYBRID AND ELECTRIC VEHICLE BATTERY MAINTENANCE DEVICE; and U.S. Ser. No. 13/567,463, filed Aug. 6, 2012, entitled BATTERY TESTERS WITH SECONDARY FUNCTIONALITY; which are incorporated herein by reference in their entirety.

When performing tests on an individual battery within a battery pack, the accuracy of the test can be affected by other batteries within the pack which are electrically connected to the battery under test. Thus, typically, in order to obtain accurate test results, the battery under test is disconnected from other batteries within the pack. This requires that the battery pack be taken "offline" during the procedure, requires additional use of maintenance personnel, and may result in failure of the battery pack if the battery pack is reassembled improperly. The present invention provides a method and apparatus for improving the accuracy of the battery test performed on a battery within the battery pack, without requiring that the battery be disconnected from the pack.

FIG. 1 is a simplified block diagram of a battery pack 100 in accordance with one example configuration. In this example, pack 100 comprises 3 batteries 102*a*, 102*b*, and 102*c* electrically connected in parallel. However, this is but one example configuration and the present invention is not limited to this. As described above, the present invention allows the testing of a single battery within pack 100 without disconnecting that battery from the other batteries within the pack.

Figure 2:
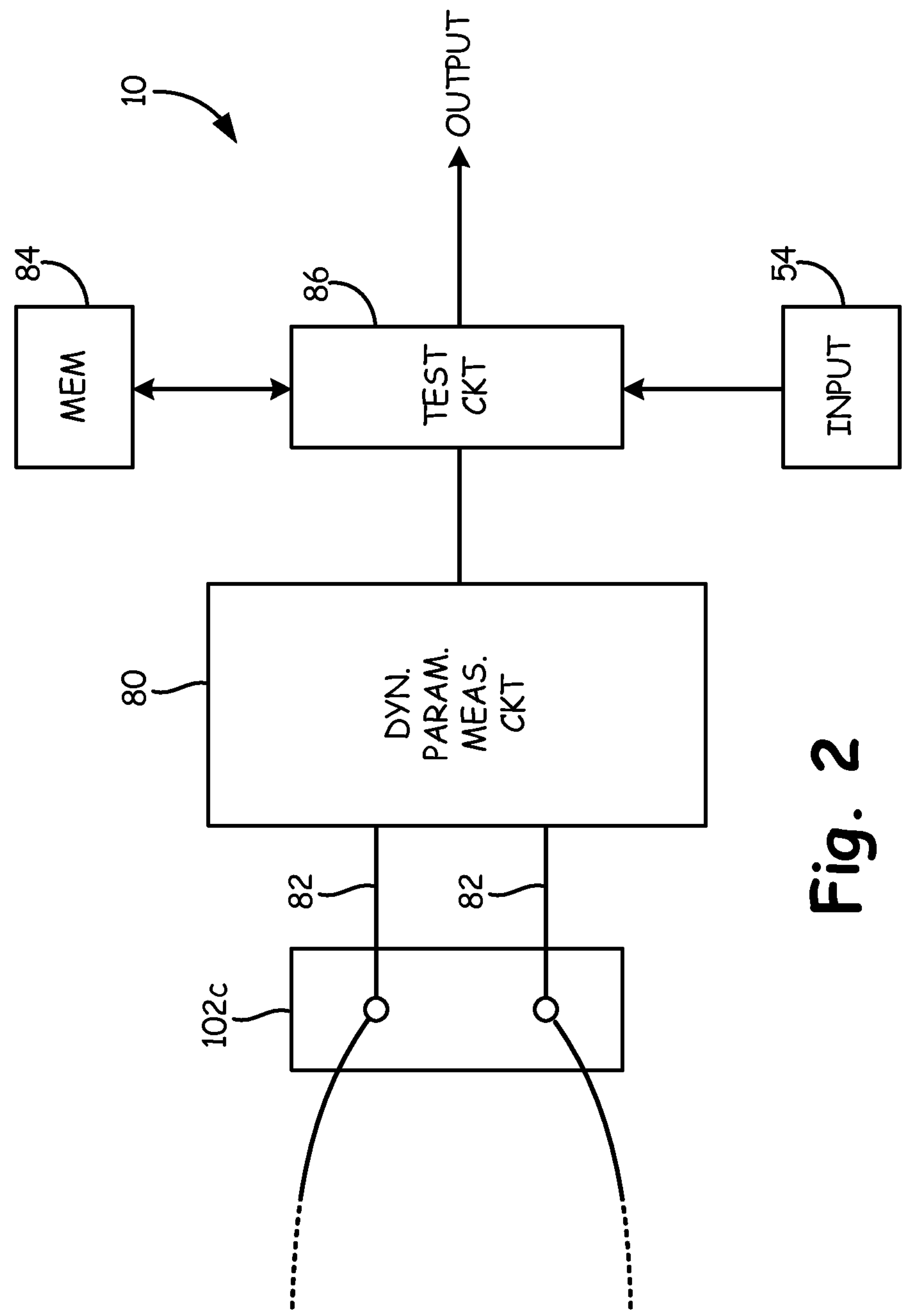
FIG. 2 is a simplified block diagram of an electronic battery tester in accordance with one embodiment of the present invention.

FIG. 2 is a simplified block diagram of battery tester 10 in accordance with one embodiment of the present invention. In FIG. 2, tester 10 includes dynamic parameter measurement circuitry 80 which couples to battery 102*c* of pack 100 through Kelvin connections 82. Dynamic parameter measurement circuitry 80 can be any circuit configuration which measures a dynamic parameter of battery 102*c*. As used herein, a dynamic parameter is one which is related to a signal having an AC component. The signal having an AC component is referred to herein as "a forcing function." The AC component of the forcing function signal may include periodic or transient components. Typically, the forcing function signal is relatively small in comparison to the voltages of the battery pack 100. However, in some embodiments, large signals may also be used. The forcing function signal can be applied directly to the battery 102*c* or drawn from the battery 102*c*. Example dynamic parameters include dynamic resistance, conductance, impedance, admittance, etc. This list is not exhaustive. For example, a dynamic parameter can include a component value of an equivalent circuit of battery 102*c*. Memory 84 is configured to store a plurality of different test criteria. For example, the test criteria can be a number of different thresholds or values which are used to provide an indication as to whether the battery 102*c* is "good". Input 54, which can comprise a user input, is coupled to test circuitry 86. Test circuitry 86 applies a test criteria for memory 84 based upon user input 54 to the dynamic parameter measured by dynamic parameter measurement circuitry 80. Based upon this comparison, an output is provided. FIG. 2 is a very simplified block diagram and in actual practice a number of the individual elements can be implemented in a single microprocessor and other circuit configurations. Input 54 can be any type of input and is not limited to a user input.

As referenced above, the test criteria used to perform the test on the battery 102*c* can be adjusted using a compensation factor which is related to the battery pack. For example, the relationship may be based upon the configuration of the battery pack and/or the number of batteries in the pack as well as the type and size of the batteries in the pack. The correction factor is based upon the determination that weak batteries within the pack have a stronger (or greater) influence when measuring the capacity of the entire battery pack relative to any "good" neighboring batteries. Thus, the measured capacity must be lower when directly testing a battery by connecting to the post of that battery when the testing equipment is coupled to a weak battery in comparison to when testing a "good" battery. This difference in the measured capacity can be used to detect weak batteries within a battery pack. In the discussion below, the following equations are used:

$$\text{measured capacity} = \text{measured capacity} \times 2 \quad \text{Equation 1}$$

$$\text{pack rating} = \text{battery rating} \times \text{number of batteries in the pack} \quad \text{Equation 2}$$

$$\text{correction factor} = \frac{\text{measured pack capacity}}{\text{rated pack capacity}} \times 100\% \quad \text{Equation 3}$$

$$\%\ \text{conductance}(\%\ G) = \frac{\text{measured capacity}}{\text{rated capacity}} \times 100\% \quad \text{Equation 4}$$

$$\text{adjusted}\ \%\ G = \frac{\text{normal}\ \%\ G}{\text{correction factor}} \times 100\% \quad \text{Equation 5}$$

Using the above equations, the following discussion describes the determination of the correction factor for a 24-volt series-parallel battery pack configuration consisting of six batteries in optimal condition (i.e. with open circuit voltages greater than or equal to 12.7 volts and a conductance rating of nearly 100%). The measured pack capacity was determined by performing multiple battery tests on each individual battery of the pack and averaging the results. The theoretical pack capacity, consisting of the individual battery rating times the number of batteries in the pack, was treated as the 100% target. Thus, a pack battery in optimal condition should result in an adjusted conductance value of 100%.

TABLE 1

| BATTERY # | AVG. VOLTAGE | AVG. MEASURED | 24 V COMP. | DERATING |
|---|---|---|---|---|
| 1 | 12.79 V | 1077.83 A(EN) | 2155.67 A(EN) | 44.08% |
| 2 | 12.88 V | 1077.67 A(EN) | 2155.33 A(EN) | 44.08% |
| 3 | 12.86 V | 1117.39 A(EN) | 2234.78 A(EN) | 45.70% |
| 4 | 12.84 V | 1134.44 A(EN) | 2268.89 A(EN) | 46.40% |
| 5 | 12.91 V | 1113.78 A(EN) | 2227.56 A(EN) | 45.55% |
| 6 | 12.97 V | 1090.11 A(EN) | 2180.22 A(EN) | 44.59% |
| 1-6 | 12.87 V | 1101.87 A(EN) | 2203.74 A(EN) | 45.07% |

Using the values set forth in Table 1, the following can be calculated:

$$\text{measured capacity} = \text{measured capacity} \times 2$$

$$\text{pack rating} = \text{battery rating} \times \text{number of batteries in the pack} \quad \text{Equation 6}$$

$$\text{correction factor} = \frac{\text{measured pack capacity}}{\text{rated pack capacity}} \times 100\% \quad \text{Equation 7}$$

$$\%\ \text{conductance}(\%\ G) = \frac{\text{measured capacity}}{\text{rated capacity}} \times 100\% \quad \text{Equation 8}$$

$$\text{adjusted}\ \%\ G = \frac{\text{normal}\ \%\ G}{\text{correction factor}} \times 100\% \quad \text{Equation 9}$$

Batteries within the battery pack can be individually tested using standard dynamic parameter testing techniques. However, the measured dynamic parameter values may then be adjusted according to a predetermined correction factor dependent upon the selected battery configuration and the number of batteries within a battery pack. The adjusted dynamic parameter after applying this correction factor, may be used to make a determination if a particular battery is good or should be replaced or recharged.

Figure 3:
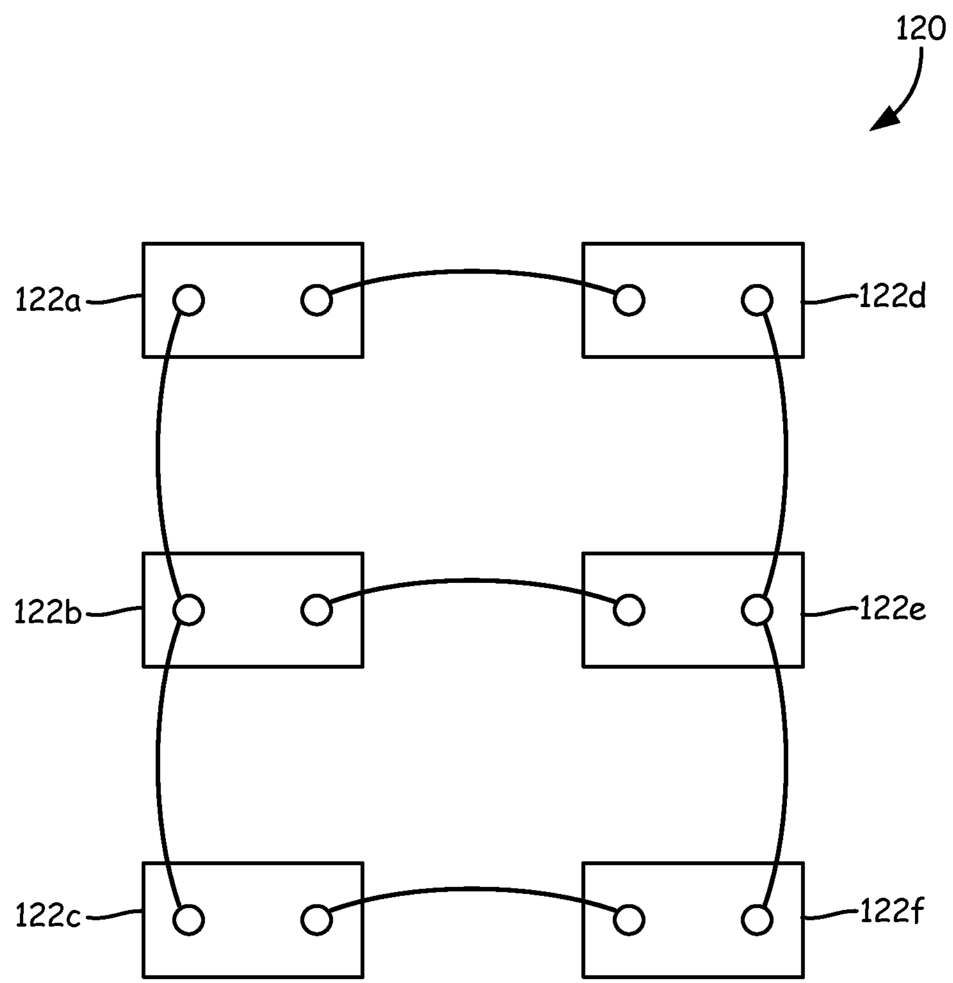
FIG. 3 is a simplified diagram of a battery pack having six batteries connected in a series-parallel configuration.

FIG. 3 is a simplified diagram of a battery pack 120 including six batteries 122*a-f* arranged in a series-parallel configuration. Initially, pack 120 was configured using six "good" batteries each having the following characteristics:

TABLE 2

| BATTERY # | DECISION | VOLTAGE | MEASURED | TEMP. | G |
|---|---|---|---|---|---|
| 122a | GOOD | 12.85 V | 830 A(EN) | 20° C. | 101.84% |
| 122b | GOOD | 12.89 V | 826 A(EN) | 20° C. | 101.35% |
| 122c | GOOD | 12.89 V | 787 A(EN) | 20° C. | 96.56% |
| 122d | GOOD | 13.04 V | 805 A(EN) | 20° C. | 98.77% |
| 122e | GOOD | 13.04 V | 799 A(EN) | 20° C. | 98.04% |
| 122f | GOOD | 12.83 V | 751 A(EN) | 20° C. | 92.15% |

Subsequently, with the six batteries connected in the series-parallel configuration shown in FIG. 3 and the following measurements were obtained:

TABLE 3

| BATTERY # | DECISION | VOLTAGE | MEASURED | RAW G | ADJUSTED G |
|---|---|---|---|---|---|
| 122a | GOOD | 12.80 V | 1105 A(EN) | 44% | 97% |
| 122b | GOOD | 12.89 V | 1099 A(EN) | 43% | 95% |
| 122c | GOOD | 12.81 V | 1102 A(EN) | 44% | 97% |
| 122d | GOOD | 12.89 V | 1112 A(EN) | 44% | 97% |
| 122e | GOOD | 12.88 V | 1065 A(EN) | 42% | 93% |
| 122f | GOOD | 12.81 V | 1024 A(EN) | 41% | 89% |

Subsequently, battery 122*f* was replaced with a battery having the following characteristics:

TABLE 4

| BATTERY # | DECISION | VOLTAGE | MEASURED | TEMP. | G |
|---|---|---|---|---|---|
| 122f | C&R | 12.29 V | 553 A(EN) | 20° C. | 67.85% |

The measured characteristics of the replacement battery **122*f*** indicated that it should be charged and retested. When that battery was inserted into the battery pack, the following measurements were obtained:

TABLE 5

| BATTERY # | DECISION | VOLTAGE | MEASURED | RAW G | ADJUSTED G |
|---|---|---|---|---|---|
| 122a | GOOD | 12.78 V | 1094 A(EN) | 43% | 95% |
| 122b | GOOD | 12.85 V | 1097 A(EN) | 43% | 95% |
| 122c | GOOD | 12.78 V | 1086 A(EN) | 43% | 95% |
| 122d | GOOD | 12.83 V | 1100 A(EN) | 43% | 95% |
| 122e | GOOD | 13.24 V | 1032 A(EN) | 41% | 91% |
| 122f | GOOD | 12.36 V | 849 A(EN) | 33% | 73% |

As illustrated in the "RAW G" column in Table 5, the one bad battery inserted into the pack caused measurements of the other five batteries to indicate that those batteries were at less than 50% capacity. However, once the battery conductance was adjusted using the correction factor determined for the pack, the one failing battery is clearly indicated having a conductance rating of 73%. While the other good batteries have a rating of over 90%.

Figure 4:
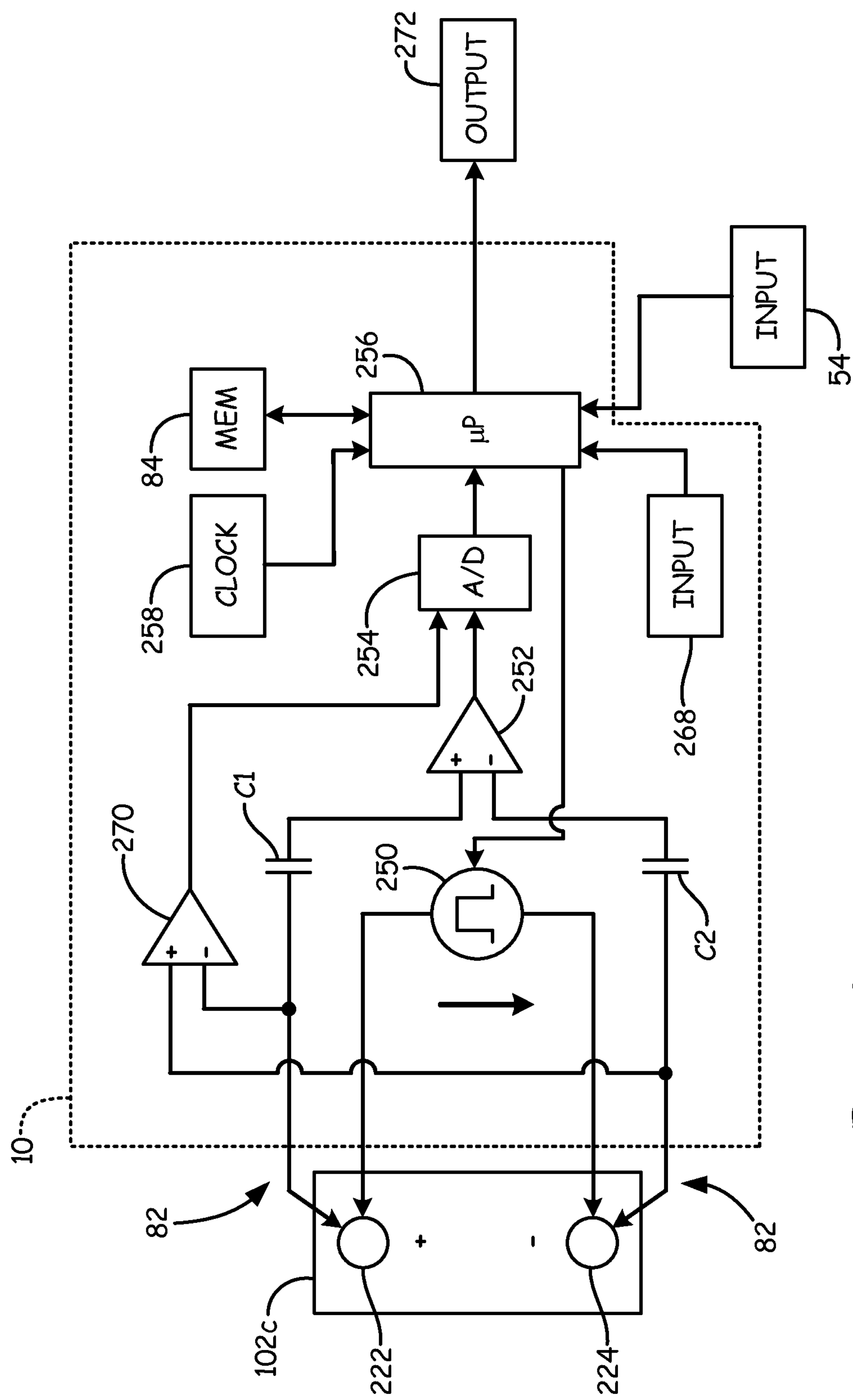
FIG. 4 is a simplified schematic diagram of the battery tester of FIG. 2.

FIG. 4 is a more detailed block diagram of battery test circuitry 10 of FIG. 2. In a preferred embodiment, circuitry 10 operates, with the exceptions and additions as discussed below, in accordance with battery testing methods described in one or more of the United States patents obtained by Midtronics, Inc. and Dr. Champlin and listed above. Circuitry 10 operates in accordance with one embodiment of the present invention and determines the conductance (GBAT) of battery **102*c* and the voltage potential (VBAT) between terminals 222 and 224 of battery 102*c*. Circuitry 10 includes current source 250, differential amplifier 252, analog-to-digital converter 254 and microprocessor 256. Current source 250 provides one example of a forcing function for use with the invention. Amplifier 252 is capacitively coupled to battery 102*c* through capacitors C1 and C2. Amplifier 252 has an output connected to an input of analog-to-digital converter 254. Microprocessor 256 is connected to system clock 258, memory 84, and analog-to-digital converter 254. Microprocessor 256 is also capable of receiving an input from input devices 268 and 54. Microprocessor 256 also connects to output device 272**.

In operation, current source 250 is controlled by microprocessor 256 and provides a current I in the direction shown by the arrow in FIG. 4. Microprocessor 256 also controls the level (i.e., peak to peak, RMS, etc.) of the time varying component of the forcing function. In one embodiment, this is a sine wave, square wave or a pulse. Differential amplifier 252 is connected to terminals 222 and 224 of battery **102*c* through capacitors C1 and C2, respectively, and provides an output related to the voltage potential difference between terminals 222 and 224. In a preferred embodiment, amplifier 262 has a high input impedance. Circuitry 10 includes differential amplifier 270 having inverting and noninverting inputs connected to terminals 224 and 222, respectively. Amplifier 270 is connected to measure the open circuit potential voltage (VBAT) of battery 102*c* between terminals 222 and 224 and is one example of a dynamic response sensor used to sense the time varying response of the battery 102*c* to the applied time varying forcing function. The output of amplifier 262 is provided to analog-to-digital converter 254 such that the voltage across terminals 222 and 224 can be measured by microprocessor 256**.

Circuitry 10 is connected to battery **102*c* through a four-point connection technique known as a Kelvin connection. This Kelvin connection allows current I to be injected into battery 102*c* through a first pairs of terminals while the voltage V across the terminals 222 and 224 is measured by a second pair of connections. Because very little current flows through amplifier 252, the voltage drop across the inputs to amplifier 252 is substantially identical to the voltage drop across terminals 222 and 224 of battery 102*c*. The output of differential amplifier 252 is converted to a digital format and is provided to microprocessor 256. Microprocessor 256 operates at a frequency determined by system clock 258 and in accordance with programming instructions stored in memory 84**.

Microprocessor 256 determines the conductance of battery **102*c* by applying a current I using current source 250. This measurement provides a dynamic parameter related to the battery. Of course, any such dynamic parameter can be measured including resistance, admittance, impedance or their combination along with conductance. Further, any type of time varying signal can be used to obtain the dynamic parameter. The signal can be generated using an active forcing function or using a forcing function which provides a switchable load, for example, coupled to the battery 102*c*. The microprocessor determines the change in battery voltage due to the current pulse I using amplifier 252 and analog-to-digital converter 254. The value of current I generated by current source 250 is known and is stored in memory 84. In one embodiment, current I is obtained by applying a load to battery 102*c*. Microprocessor 256 calculates the conductance of battery 102*c*** using the following equation:

$$\text{Conductance}=G\text{BAT}=\Delta I/\Delta V \quad \text{Equation 10}$$

where ΔI is the change in current flowing through battery **102*c* due to current source 250 and ΔV is the change in battery voltage due to applied current ΔI. Based upon the battery conductance GBAT, the correction factor and the battery voltage, the battery tester 10 determines the condition of battery 102*c*. Battery tester 10** is programmed with information which can be used with the determined battery conductance and voltage as taught in the above listed patents to Dr. Champlin and Midtronics, Inc.

The tester can compare the measured and corrected CCA (Cold Cranking Amp) with the rated CCA for that particular battery. Microprocessor 256 can also use information input from input device 54 provided by, for example, an operator. This information may consist of the particular type of battery, location, time, the name of the operator. Additional information relating to the conditions of the battery test can be received by microprocessor 256 from input device 268. Input device 268 may comprise one or more sensors, for example, or other elements which provide information such as ambient or battery temperature, time, date, humidity, barometric pressure, noise amplitude or characteristics of noise in the battery or in the test result, or any other information or data which may be sensed or otherwise recovered which relates to the conditions of the test how the battery test was performed, or intermediate results obtained in conducting the test. Additional test condition information is provided by microprocessor 256. Such additional test condition information may include the values of GBAT and battery voltage, the various inputs provided to battery tester 10 by the operator which may include, for example, type of battery, estimated ambient or battery temperature, type of vehicle (i.e., such as provided through the Vehicle Identification Number (VIN) code for the vehicle) or the particular sequence of steps taken by the operator in conducting the test.

Although the embodiment illustrated in FIG. 4 shows a current source 250, element number 250 can be viewed as a forcing function and can be either an applied current, an applied load, an applied voltage or their combination.

Thus, as discussed above, with the present invention a "correction factor" is determined for a battery pack. This correction factor is applied to subsequent measurements of batteries connected in the pack in order to identify a bad or failing battery. The correction factor can be initially determined by configuring a battery pack with batteries which are considered to be in good condition. The correction factor can be applied to any dynamic parameter which is obtained for batteries within the battery pack, while the battery is connected to the battery pack. The correction factor can be stored, for example, in memory 84 and retrieved by the microprocessor 256. The memory 84 may contain multiple correction factors for different battery packs and/or different battery pack configurations. The microprocessor can retrieve the appropriate correction factor from the memory based upon, for example, a user input received from an operator which identifies the type of battery pack being tested. In some instances, it may be possible for the microprocessor to independently identify the appropriate correction factor. For example, this may be through detection of battery pack voltage or other means. If multiple correction factors are stored in the memory, these correction factors may be supplemented as desired or otherwise updated. This information may be stored in the memory 84 during manufacture of the device, or may be inputted at a later date, for example, using the user input or other technique.

In one embodiment, in order to obtain measurements of individual batteries, an output can be provided to an operator querying the operator regarding the configuration of a battery pack including the number of batteries in the pack as well as their arrangement (series parallel or series-parallel). The microprocessor 256 may then instruct the operator to connect the battery tester 10 sequentially to each of the batteries within the battery pack 100 based upon these steps and the dynamic parameters collected by the battery tester 10, the microprocessor 256 applies the correction factor to the measured dynamic parameters and provides an output to the operator indicating the conditions of the measured batteries. This output can be in the form of a pass/fail output and may also include relative or absolute information showing a comparison between each of the batteries in the battery pack.

The correction factor allows the measured parameters to be applied to standardized testing criteria in order to determine whether a battery is good or bad. This allows the existing, well-developed testing criteria to be applied to batteries in a battery pack without necessitating changing of the test criteria. Thus, existing test criteria can continue to be used with batteries within battery packs of various configurations simply by using the appropriate correction factor.

Although the present invention has been described with reference to preferred embodiments, workers skilled in the art will recognize that changes may be made in form and detail without departing from the spirit and scope of the invention. As used herein, the term "nominal" refers to a condition of a battery or battery pack which is operating within normal specifications.

What is claimed is:

1. An apparatus for testing batteries connected in a battery pack, wherein the battery pack comprises a plurality of batteries, the apparatus comprising:

a forcing function generator configured to apply a forcing function signal to a battery in the battery pack;

measurement circuitry configured to measure a response of the battery to the applied forcing function signal;

a memory containing a capacity-compensation correction factor calculated from an average measured capacity of a nominal battery pack and a rated pack capacity representing a rated capacity of the nominal battery pack as a whole, wherein the average measured capacity of the nominal battery pack is determined by applying the forcing function to each battery in the battery pack while the battery is interconnected in the nominal battery pack to form a separate measure of the capacity of the nominal battery pack for each battery and forming an average of the separate measures; and a microprocessor configured to calculate a corrected dynamic parameter based upon the applied forcing function signal, the response of the battery to the applied forcing function signal and the capacity-compensation correction factor stored in the memory, wherein the corrected dynamic parameter comprises a measured dynamic parameter which is corrected due to errors introduced in the response measurement arising from other batteries in the battery pack, and the microprocessor is further configured to determine a condition of each battery within the battery pack based upon its corrected dynamic parameter.

2. The apparatus of claim 1 including a user input configured to receive an input from an operator.

3. The apparatus of claim 1 including a display configured to display an output to an operator, wherein the display is further configured to instruct the operator to test individual batteries within the battery pack.

4. The apparatus of claim 1 wherein the memory contains a plurality of capacity-compensation correction factors.

5. The apparatus of claim 4 wherein one capacity-compensation correction factor of the plurality of capacity-compensation correction factors stored in the memory is selected based upon a user input.

6. The apparatus of claim 1 wherein the capacity-compensation correction factor is based upon dynamic parameters measured in the nominal battery pack.

7. The apparatus of claim 1 including an output comprising a relative representation of conditions of batteries within the battery pack.

8. The apparatus of claim 1 wherein the dynamic parameter comprises battery conductance.

9. A method for testing batteries connected in a battery pack, the battery pack comprising a plurality of batteries, the method comprising:

establishing a capacity-compensation correction factor by:

forming a battery pack using a plurality of batteries which are determined to be in good condition by having met predetermined test criteria including one or more predetermined thresholds;

for each battery in the battery pack, measuring a dynamic parameter while the batteries are connected in the battery pack, the dynamic parameter for a respective battery obtained by applying a forcing function to the respective battery;

determining the capacity-compensation correction factor based upon all of the measured dynamic parameters and a rating for the battery pack as a whole;

testing a battery pack of an unknown condition, comprising:

measuring a dynamic parameter for each of the plurality of batteries in the battery pack of an unknown condition by applying a forcing function to each of the batteries;

correcting the measured dynamic parameters using the capacity-compensation correction factor to obtain corrected dynamic parameters, wherein the corrected dynamic parameters include a corrected dynamic parameter of one battery in the battery pack having a measured dynamic parameter altered by a characteristic of another battery in the battery pack, wherein the corrected dynamic parameter comprises a measured dynamic parameter which is corrected due to errors introduced in the response measurement arising from other batteries in the battery pack; and determining condition of each battery within the battery pack based upon its corrected dynamic parameter.

10. The method of claim 9 including receiving an input from an operator.

11. The method of claim 9 including displaying an output to an operator, wherein the display is further configured to instruct the operator to test individual batteries within the battery pack.

12. The method of claim 9 including storing a plurality of capacity-compensation correction factors in a memory.

13. The method of claim 12 wherein one capacity-compensation correction factor of the plurality of capacity-compensation correction factors stored in the memory is selected based upon a user input.

14. The method of claim 9 wherein the capacity-compensation correction factor is based upon dynamic parameters measured in a nominal battery pack.

15. The method of claim 9 including outputting a relative representation of conditions of batteries within the battery pack.

16. The method of claim 9 wherein the dynamic parameter comprises battery conductance.

* * * * *